United States Patent
Inoue et al.

(10) Patent No.: US 7,154,359 B2
(45) Date of Patent: Dec. 26, 2006

(54) SURFACE ACOUSTIC WAVE FILTER AND DUPLEXER INCLUDING THE SAME

(75) Inventors: Shogo Inoue, Kawasaki (JP); Jun Tsutsumi, Kawasaki (JP); Takashi Matsuda, Kawasaki (JP); Masanori Ueda, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 84 days.

(21) Appl. No.: 10/849,151

(22) Filed: May 20, 2004

(65) Prior Publication Data

US 2004/0233019 A1  Nov. 25, 2004

(30) Foreign Application Priority Data

May 20, 2003  (JP)  ............................. 2003-142700

(51) Int. Cl.
*H03H 9/64* (2006.01)
*H03H 9/72* (2006.01)

(52) U.S. Cl. ...................................... 333/193; 333/133
(58) Field of Classification Search ................ 333/193, 333/195, 133
See application file for complete search history.

(56) References Cited

U.S. PATENT DOCUMENTS

| | | | | |
|---|---|---|---|---|
| 4,931,755 A | * | 6/1990 | Sakamoto et al. | 333/193 |
| 5,077,545 A | * | 12/1991 | Gopani et al. | 333/195 |
| 6,404,303 B1 | * | 6/2002 | Kuroda | 333/193 |
| 6,472,959 B1 | * | 10/2002 | Beaudin et al. | 333/193 |

FOREIGN PATENT DOCUMENTS

| | | | | |
|---|---|---|---|---|
| JP | 54-123892 A | | 9/1979 | |
| JP | 1-135113 | * | 5/1989 | ................. 333/193 |
| JP | 4-249907 | * | 9/1992 | ................. 333/193 |
| JP | 9-162676 A | | 6/1997 | |
| JP | 9-172342 | * | 6/1997 | |
| JP | 9-321569 | * | 12/1997 | |
| JP | 11-251861 A | | 9/1999 | |
| JP | 2002-135078 | | 5/2002 | |
| JP | 2002-314367 | | 10/2002 | |
| JP | 2003-110404 | | 4/2003 | |

* cited by examiner

*Primary Examiner*—Barbara Summons
(74) *Attorney, Agent, or Firm*—Arent Fox PLLC

(57) ABSTRACT

A surface acoustic wave filter includes: an input interdigital transducer and an output interdigital transducer that are formed on a piezoelectric substrate; a capacitance that is provided between the input terminal of the input interdigital transducer and the output terminal of the output interdigital transducer; a first common ground terminal that connects the ground terminal of the input interdigital transducer and the ground terminal of the output interdigital transducer; and an inductance that is provided between the first common ground terminal and a ground.

17 Claims, 28 Drawing Sheets

-- PRIOR ART --

-- PRIOR ART --

-- PRIOR ART --

CHANGES IN CHARACTERISTICS WITH C

CHANGES IN CHARACTERISTICS WITH C

FREQUENCY [MHz]

IMPROVEMENT IN CHARACTERISTICS WITH L

CHANGES IN CHARACTERISTICS WITH C

CHANGES IN CHARACTERISTICS WITH C+L

"S-G" ARRANGEMENTS

"G-G" ARRANGEMENTS

■ GROUND ELECTRODE (G)
▨ INPUT ELECTRODE (S)
▤ OUTPUT ELECTRODE (S)

MODIFICATIONS OF "S-G" ARRANGEMENTS
Fig. 16A  $d + \frac{\lambda}{2} + n\lambda$
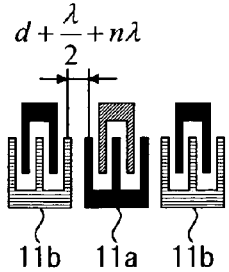
Fig. 16B  $d + \frac{\lambda}{2} + n\lambda$
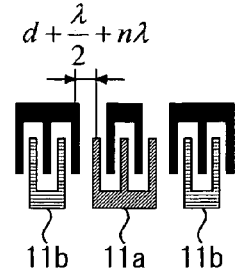
Fig. 16C  $d + \frac{\lambda}{2} + n\lambda$
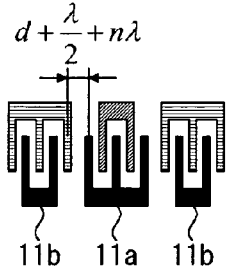
Fig. 16D  $d + \frac{\lambda}{2} + n\lambda$
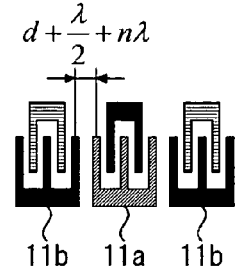
MODIFICATION OF "G-G" "S-S" ARRANGEMENTS
Fig. 16E  $d + n\lambda$
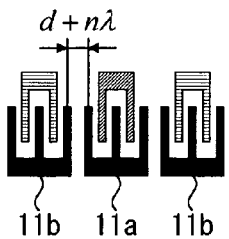
Fig. 16F  $d + n\lambda$
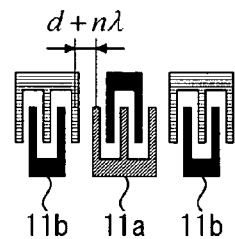
Fig. 16G  $d + n\lambda$
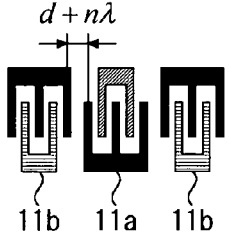
Fig. 16H  $d + n\lambda$
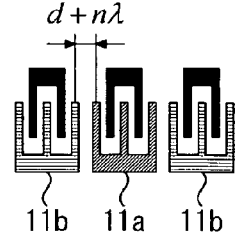
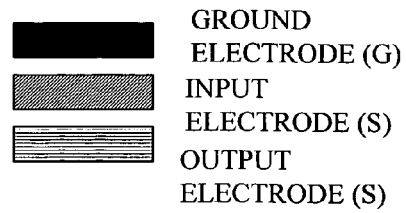

COMPARISON OF FILTER CHARACTERISTICS

SURFACE ACOUSTIC WAVE FILTER AND DUPLEXER INCLUDING THE SAME

BACKGROUND OF THE INVENTION

1. Field of the Invention

The present invention relates to a surface acoustic wave filter and a duplexer including the same.

2. Description of the Related Art

Surface acoustic wave (SAW) filters are normally used for the RF filters and antenna duplexers of portable telephone devices.

In a mobile telecommunication system involving those portable telephone devices, the transmit band and the receive band are situated very close to each other. So as to avoid crosstalk between transmitted signals and received signals, a transmit filter is required to suppress the receive band, and a receive filter is required to suppress the transmit band. Compared with any other filter device, a SAW filter normally exhibits a sharper cut-off profile in the vicinities of the pass band. However, there is an increasing demand for SAW filters with a greater degree of suppression.

So as to increase the degree of suppression on the high frequency side of the pass band of a transmit filter or a receive filter, a capacitance element may be provided between the input terminal and the output terminal of the SAW filter. This technique is disclosed in Japanese Unexamined Patent Publication Nos. 1-135113, 11-251861, 9-172342, and 9-321569, and will be hereinafter referred to as Prior Art 1. FIG. 1B shows an electric equivalent circuit that represents the structure of Prior Art 1. For purposes of comparison, FIG. 1A shows an electric equivalent circuit of a conventional structure that does not have a capacitance element between the input terminal and the output terminal.

As shown in FIG. 1B, a SAW filter 200 of Prior Art 1 has three resonances between an input terminal 4 and an output terminal 5. In this SAW filter 200, a capacitance C is also provided between the input terminal 4 and the output terminal 5. FIG. 2 shows the results of a simulation that was carried out to examine the filter characteristics of the SAW filter 100 of FIG. 1A and the filter characteristics of the SAW filter 200 of FIG. 1B. In this simulation, the SAW filters 100 and 200 were produced as 1.9 GHz band filters.

As shown in FIG. 2, the filter characteristics of the SAW filter 100 have a relatively gentle cut-off profile on the high frequency side of the pass band. On the other hand, the filter characteristics of the SAW filter 200 have a steep cut-off profile in the vicinity of the boundary between the pass band and the stop band on the high frequency side, with a zero point appearing at approximately 2.1 GHz. The capacitance C provided between the input terminal 4 and the output terminal 5 causes the zero point in the band (a stop band) on the high frequency side of the pass band. Thus, the degree of suppression on the high frequency side can be greatly increased.

So as to increase the degree of suppression on the low frequency side of the pass band of a transmit filter or a receive filter, the input ground terminal and the output ground terminal of the SAW filter may be grounded via an inductance element. This technique is disclosed in Japanese Unexamined Patent Publication Nos. 9-162676 and 54-123892, and will be hereinafter referred to as Prior Art 2. FIG. 3 illustrates the structure of Prior Art 2.

As shown in FIG. 3, a SAW filter 300 of Prior Art 2 has interdigital transducers (IDTs) 11 between the input terminal 4 and the output terminal 5. In this SAW filter 300, the ground terminals are connected to form a common ground terminal 8, and the common ground terminal 8 is grounded via an inductance L. FIG. 4 shows the result of a simulation that was carried out to examine the filter characteristics of the SAW filter 300 of FIG. 3. In this simulation, the SAW filter 300 was produced as a 1.9 band filter. For purposes of comparison, FIG. 4 also shows the filter characteristics of the SAW filter 100 of FIG. 1A.

As shown in FIG. 4, the filter characteristics of the SAW filter 300 have a steep cut-off profile in the vicinity of the boundary between the pass band and the band on the low frequency side, with a zero point appearing at approximately 1.8 GHz. The input ground terminal and the output ground terminal of the SAW filter 300 are connected and are then grounded via the inductance L, so that the zero point can appear in the band (another stop band) on the low frequency side of the pass band. Thus, the degree of suppression on the low frequency side can be greatly increased.

However, the technique of providing a capacitance between the input terminal and the output terminal in accordance with Prior Art 1 has a drawback in that the suppression on the low frequency side of the pass band decreases, though the suppression on the high frequency side of the pass band increases. For example, the degree of suppression in the frequency band of 1.8 GHz and lower may decrease with the addition of a capacitance, as shown in FIG. 2.

On the other hand, the technique of grounding the connected ground terminals through an inductance in accordance with Prior Art 2 has a drawback in that the suppression on the high frequency side of the pass band decreases, though the suppression on the low frequency side of the pass band increases. For example, the degree of suppression in the frequency band of 2.1 GHz and higher may decrease with the addition of an inductance, as shown in FIG. 4.

SUMMARY OF THE INVENTION

It is therefore an object of the present invention to provide a surface acoustic wave filter and a duplexer in which the above disadvantages are eliminated.

A more specific object of the present invention is to provide a surface acoustic wave filter that has an increased degree of stop-band suppression both on the high frequency side and the low frequency side, and a duplexer that includes the surface acoustic wave filter.

These objects of the present invention are achieved by a surface acoustic wave filter comprising: an input interdigital transducer and an output interdigital transducer that are formed on a piezoelectric substrate; a capacitance that is provided between an input terminal of the input interdigital transducer and an output terminal of the output interdigital transducer; a first common ground terminal that connects a ground terminal of the input interdigital transducer and a ground terminal of the output interdigital transducer; and an inductance that is provided between the first common ground terminal and a ground.

The above objects of the present invention are also achieved by a surface acoustic wave filter comprising a plurality of surface acoustic wave filters that are cascade-connected, each cascade-connected surface acoustic wave filter including: an input interdigital transducer and an output interdigital transducer that are formed on a piezoelectric substrate; a capacitance that is provided between an input terminal of the input interdigital transducer and an output terminal of the output interdigital transducer; a first common ground terminal that connects a ground terminal of the input interdigital transducer and a ground terminal of the output interdigital transducer; and an inductance that is provided between the first common ground terminal and a ground.

The above objects of the present invention are also achieved by a surface acoustic wave filter comprising a plurality of surface acoustic wave filters that are parallel-connected, each parallel-connected surface acoustic wave filter including: an input interdigital transducer and an output interdigital transducer that are formed on a piezoelectric substrate; a capacitance that is provided between an input terminal of the input interdigital transducer and an output terminal of the output interdigital transducer; a first common ground terminal that connects a ground terminal of the input interdigital transducer and a ground terminal of the output interdigital transducer; and an inductance that is provided between the first common ground terminal and a ground.

The above objects of the present invention are also achieved by a duplexer comprising a surface acoustic wave filter that includes: an input interdigital transducer and an output interdigital transducer that are formed on a piezoelectric substrate; a capacitance that is provided between an input terminal of the input interdigital transducer and an output terminal of the output interdigital transducer; a first common ground terminal that connects a ground terminal of the input interdigital transducer and a ground terminal of the output interdigital transducer; and an inductance that is provided between the first common ground terminal and a ground.

BRIEF DESCRIPTION OF THE DRAWINGS

Other objects, features and advantages of the present invention will become more apparent from the following detailed description when read in conjunction with the accompanying drawings, in which:

FIGS. 16A through 16H show modifications of the "S-G" arrangements, the "G-G" arrangements, and the "S-S" arrangements shown in FIGS. 14A through 14H;

DESCRIPTION OF THE PREFERRED EMBODIMENTS (Principles of the Invention)

First, the principles of the present invention will be described.

Figure 5:
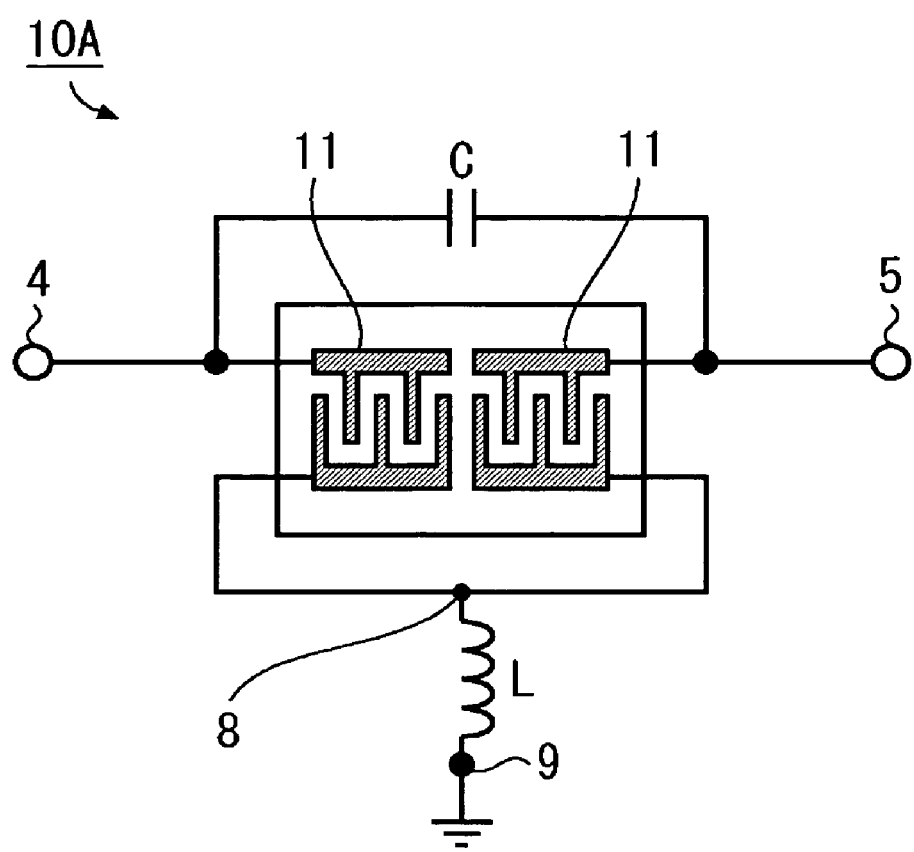
FIG. 5 shows an equivalent circuit of a SAW filter that embodies the principles of the present invention.

FIG. 5 is a circuit diagram of a surface acoustic wave (SAW) filter 10A that embodies the principles of the present invention. As shown in FIG. 5, the SAW filter 10A includes interdigital transducers (IDTs) 11 and a capacitance C that is parallel-connected to an input terminal 4 and an output terminal 5. The ground terminals of the IDTs 11 are connected to each other to form a common ground terminal 8, and are grounded through an inductance L. In this structure, the inductance L is located between the common ground terminal 8 and an external ground terminal 9.

With the capacitance C being provided between the input terminal 4 and the output terminal 5 of the SAW filter 10A, the zero point (the attenuation pole) appears on the high frequency side of the pass band, and the degree of suppression is increased. This mechanism will be described below in greater detail.

The SAW filter 10A shown in FIG. 5 can be considered as a two-terminal pair circuit. Accordingly, the band-pass characteristics (the filter characteristics) ($s_{21}$) of the SAW filter 10A can be expressed by the following expression (3) using the elements of an admittance (Y) matrix:

$$s_{21} = \frac{-\frac{2y_{21}}{y_{out}}}{\left(1 + \frac{y_{11}}{y_{in}}\right)\left(1 + \frac{y_{22}}{y_{out}}\right) - \frac{y_{12}y_{21}}{y_{in}y_{out}}} \quad (3)$$

where $y_{in}$ is the reciprocal of the terminal resistance of the input end, and $y_{out}$ is the reciprocal of the terminal resistance of the output end.

Figure 6:
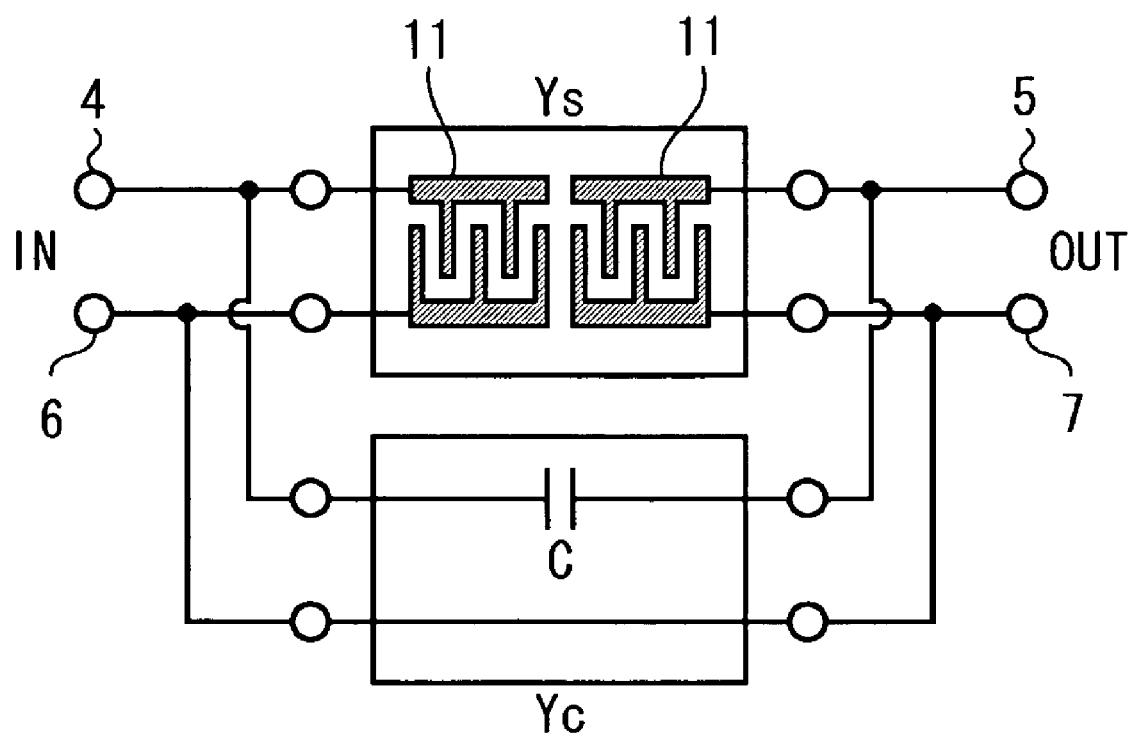
FIG. 6 shows an equivalent circuit of a structure in which the two-terminal pair circuit of the SAW filter of FIG. 5 and a series-capacitance two-terminal pair circuit are connected in parallel.

In accordance with the expression (3), when $y_{21}$ is zero, $s_{21}$ also becomes zero, and a zero point appears in the band-pass characteristics. Therefore, only the $y_{21}$ component of the two-terminal pair circuit should be taken into consideration in the mechanism for increasing the degree of suppression with the addition of a capacitance. Here, the structure having a capacitance C between the input terminal and the output terminal of the SAW filter 10A can be employed in a structure shown in FIG. 6. In the structure shown in FIG. 6, the two-terminal pair circuit of the SAW filter 10A is parallel-connected to a series-capacitance two-terminal pair circuit. The admittance matrix obtained after the parallel connection of the two-terminal pair circuits is equal to the sum of the admittance matrices of the respective circuits (Y=Ys+Yc). Here, the admittance matrix Yc of the series capacitance can be expressed by the following expression (4):

$$Y_C = \begin{pmatrix} j\omega C & -j\omega C \\ -j\omega C & j\omega C \end{pmatrix} \quad (4)$$

Figure 1A:
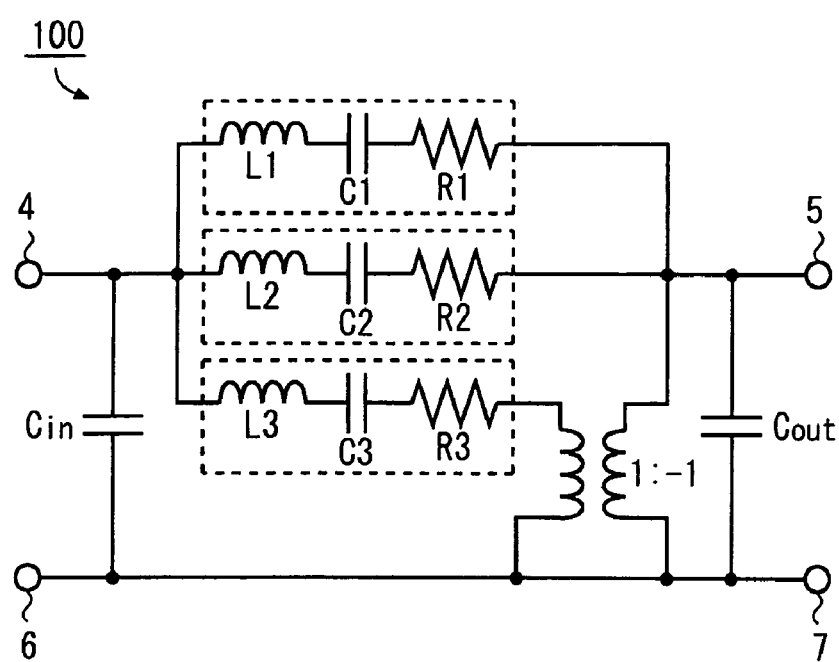
FIG. 1A shows an equivalent circuit of a conventional SAW filter without a capacitance element.
Figure 7A:
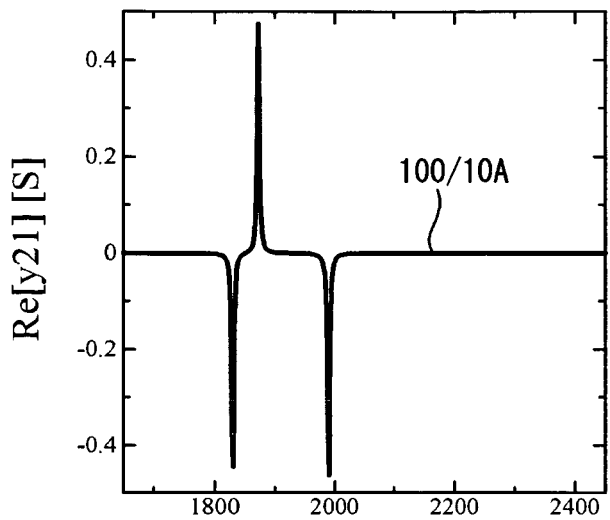
FIGS. 7A through 7C are graphs showing the changes in the real part and the imaginary part of $y_{21}$ and the changes in the frequency characteristics and band-pass characteristics that were caused by adding the capacitance C to the SAW filter of FIG. 1A.
Figure 7B:
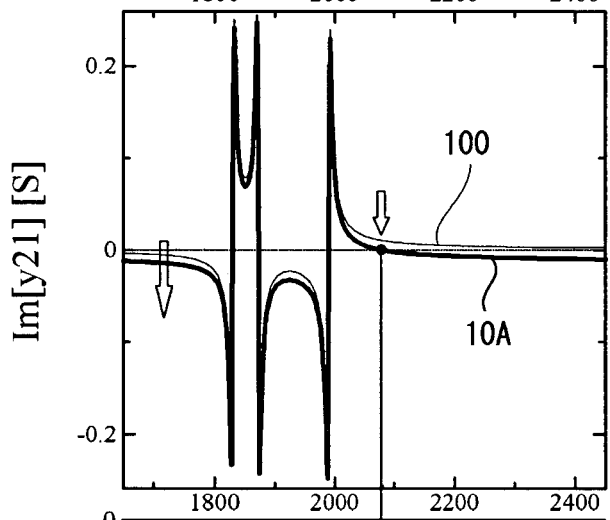
Figure 7C:
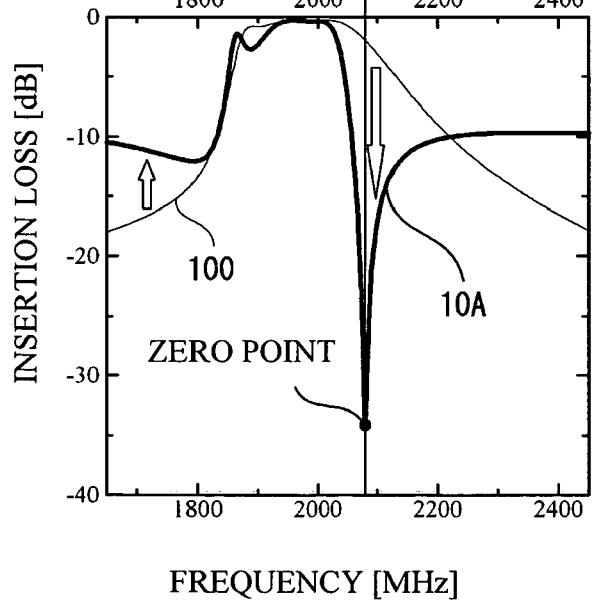

In accordance with the expression (4), the real part of $y_{21}$ does not change with the addition of the capacitance C between the input terminal and the output terminal, but the imaginary part of $y_{21}$ decreases by $\omega C$. FIGS. 7A through 7C show examples of calculations of the frequency characteristics and the band-pass characteristics of the real part and the imaginary part of $y_{21}$ with and without the capacitance C. In the calculations of the admittance matrix of the SAW filter 10A shown in FIGS. 7A through 7C, the same circuit structure as the equivalent circuit shown in FIG. 1A was used. FIG. 7A shows the frequency characteristics of the real part Re ($y_{21}$ [S]) of each admittance $y_{21}$ of the SAW filter 100 and the SAW filter 10A. FIG. 7B shows the frequency characteristics of the imaginary part Im ($y_{21}$ [S]) of each admittance $y_{21}$ of the SAW filter 100 and the SAW filter 10A. FIG. 7C shows the filter characteristics of the SAW filter 100 and the SAW filter 10A. In these graphs, the arrows indicate the shifting directions of the admittance characteristics and the filter characteristics of the SAW filter 10A with respect to the admittance characteristics and the filter characteristics of the SAW filter 100. In FIG. 7C, a downward arrow indicates an increase in the degree of suppression, while an upward arrow indicates a decrease in the degree of suppression.

As is apparent from FIGS. 7A through 7C, the addition of the capacitance C reduces the imaginary part of $y_{21}$, and produces the frequency that makes the imaginary part of $y_{21}$ zero in the vicinity of 2080 MHz. At this frequency, the real part of $y_{21}$ is also approximately zero, and accordingly, the absolute value of $y_{21}$ becomes approximately zero. Thus, a zero point appears in the band-pass characteristics.

When the capacitance C is provided between the input terminal and the output terminal, however, the absolute value of the imaginary part of $y_{21}$ becomes greater on the low frequency side of the pass band, and the absolute value of $s_{21}$ becomes greater, as shown in the graphs. As a result, the degree of suppression decreases in the band-pass characteristics.

Figure 8:
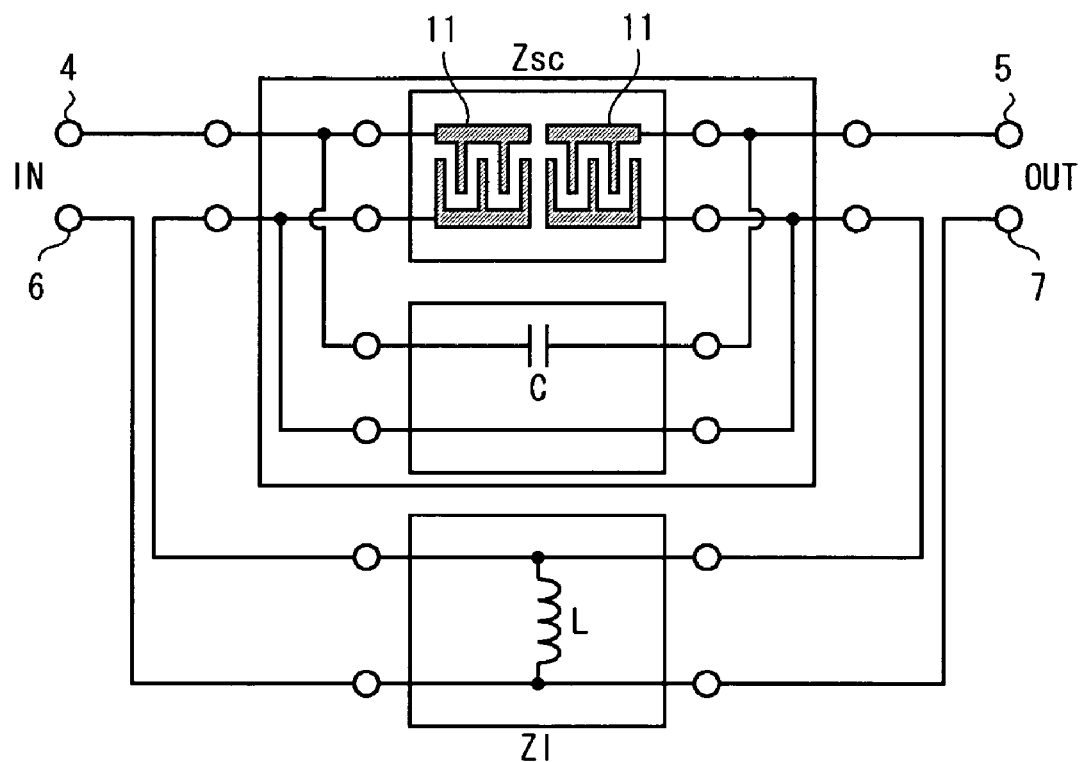
FIG. 8 shows an equivalent circuit of the SAW filter of FIG. 5 in the form of a two-terminal pair circuit.

So as to solve this problem, the inductance L is provided between the common ground terminal 8 and the external ground terminal 9 of the SAW filter 10A of the present invention, as shown in FIG. 5. FIG. 8 is a circuit diagram schematically showing the SAW filter 10A in the form of a two-terminal pair circuit. The band-pass characteristics ($s_{21}$) of the SAW filter 10A can be expressed by the following expression (5) using the elements of an impedance (Z) matrix:

$$s_{21} = \frac{\frac{2z_{21}}{z_{in}}}{\left(1 + \frac{z_{11}}{z_{in}}\right)\left(1 + \frac{z_{22}}{z_{out}}\right) - \frac{z_{12}z_{21}}{z_{in}z_{out}}} \quad (5)$$

where $z_{in}$ is the terminal resistance of the input end, and $Z_{out}$ is the terminal resistance of the output end.

In accordance with the expression (5), when $z_{21}$ is zero, $s_{21}$ also becomes zero, and a zero point appears in the band-pass characteristics. Therefore, only the $z_{21}$ component of the two-terminal pair circuit should be taken into consideration in the mechanism for increasing the degree of suppression with the addition of an inductance. Here, the structure having an inductance L between the common ground terminal 8 and the external ground terminal 9 of the SAW filter 10A can be employed in the structure shown in FIG. 8. In the structure shown in FIG. 8, the two-terminal pair circuit of the SAW filter 10A is series-connected to a parallel-inductance two-terminal pair circuit. The impedance matrix obtained after the series connection of the two-terminal pair circuits is equal to the sum of the impedance matrices of the respective circuits (Z=Zsc+Z1). Here, the impedance matrix Z1 of the parallel inductance can be expressed by the following expression (6):

$$Zl = \begin{pmatrix} j\omega L & j\omega L \\ j\omega L & j\omega L \end{pmatrix} \quad (6)$$

Figure 9A:
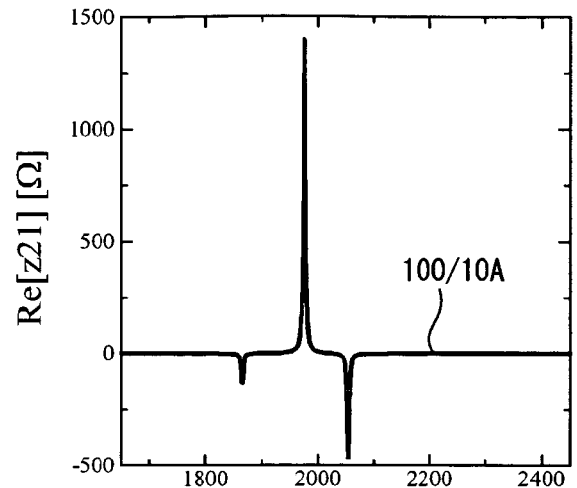
FIGS. 9A through 9C are graphs showing the changes in the real part and the imaginary part of $z_{21}$ and the changes in the frequency characteristics and band-pass characteristics that were caused by adding the inductance L to the SAW filter of FIG. 1B.
Figure 9B:
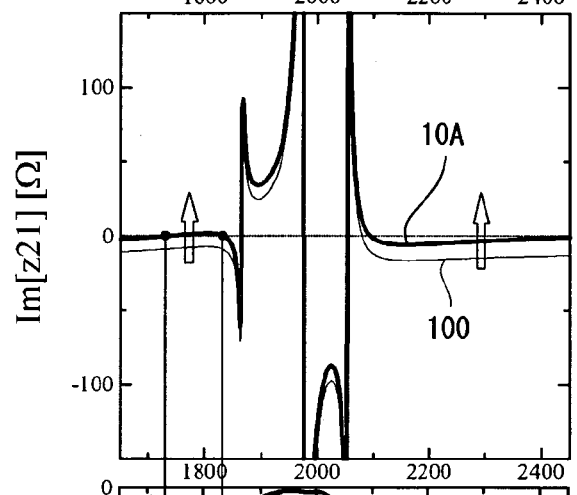
Figure 9C:
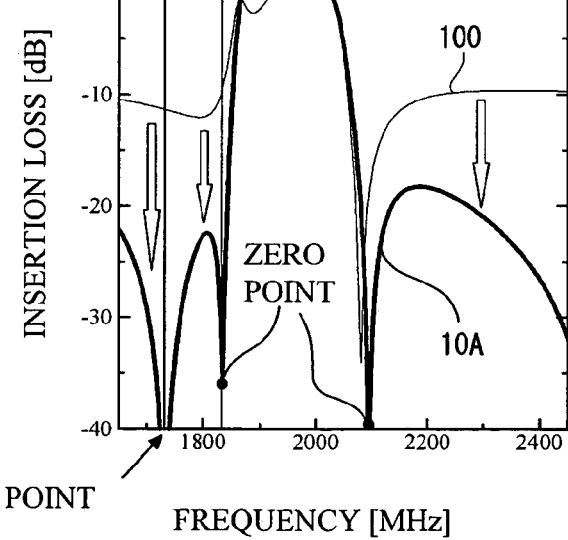

In accordance with the expression (6), the real part of $z_{21}$ does not change with the inductance L attached to the common ground terminal 8, but the imaginary part of $z_{21}$ increases by $\omega L$. FIGS. 9A through 9C show examples of calculations of the frequency characteristics and the band-pass characteristics of the real part and the imaginary part of $z_{21}$ with and without the inductance L. In the calculations of the impedance matrix of the SAW filter 10A shown in FIGS. 9A through 9C, the same circuit structure as the equivalent circuit shown in FIG. 1A was used. FIG. 9A shows the frequency characteristics of the real part Re ($z_{21}$ [Ω]) of each impedance $z_{21}$ of the SAW filter 100 and the SAW filter 10A. FIG. 9B shows the frequency characteristics of the imaginary part Im ($z_{21}$ [Ω]) of each impedance $z_{21}$ of the SAW filter 100 and the SAW filter 10A. FIG. 9C shows the filter characteristics of the SAW filter 100 and the SAW filter 10A. In these graphs, the arrows indicate the shifting directions of the impedance characteristics and the filter characteristics of the SAW filter 10A with respect to the impedance characteristics and the filter characteristics of the SAW filter 100. In FIG. 9C, a downward arrow indicates an increase in the degree of suppression, while an upward arrow indicates a decrease in the degree of suppression.

As is apparent from FIGS. 9A through 9C, the attachment of the inductance L to the common ground terminal 8 increases the imaginary part of $z_{21}$, and produces the frequencies that make the imaginary part of $z_{21}$ zero in the vicinities of 1730 MHz and 1830 MHz. At these frequencies, the real part of $z_{21}$ is also approximately zero, and accordingly, the absolute value of $z_{21}$ becomes approximately zero. Thus, zero points appear in the band-pass characteristics.

Meanwhile, on the high frequency side of the pass band, the addition of the inductance L reduces the absolute value of the imaginary part of $z_{21}$, and accordingly, the absolute value of $s_{21}$ becomes smaller. Thus, the degree of stop-band suppression is increased in the band-pass characteristics.

Figure 10:
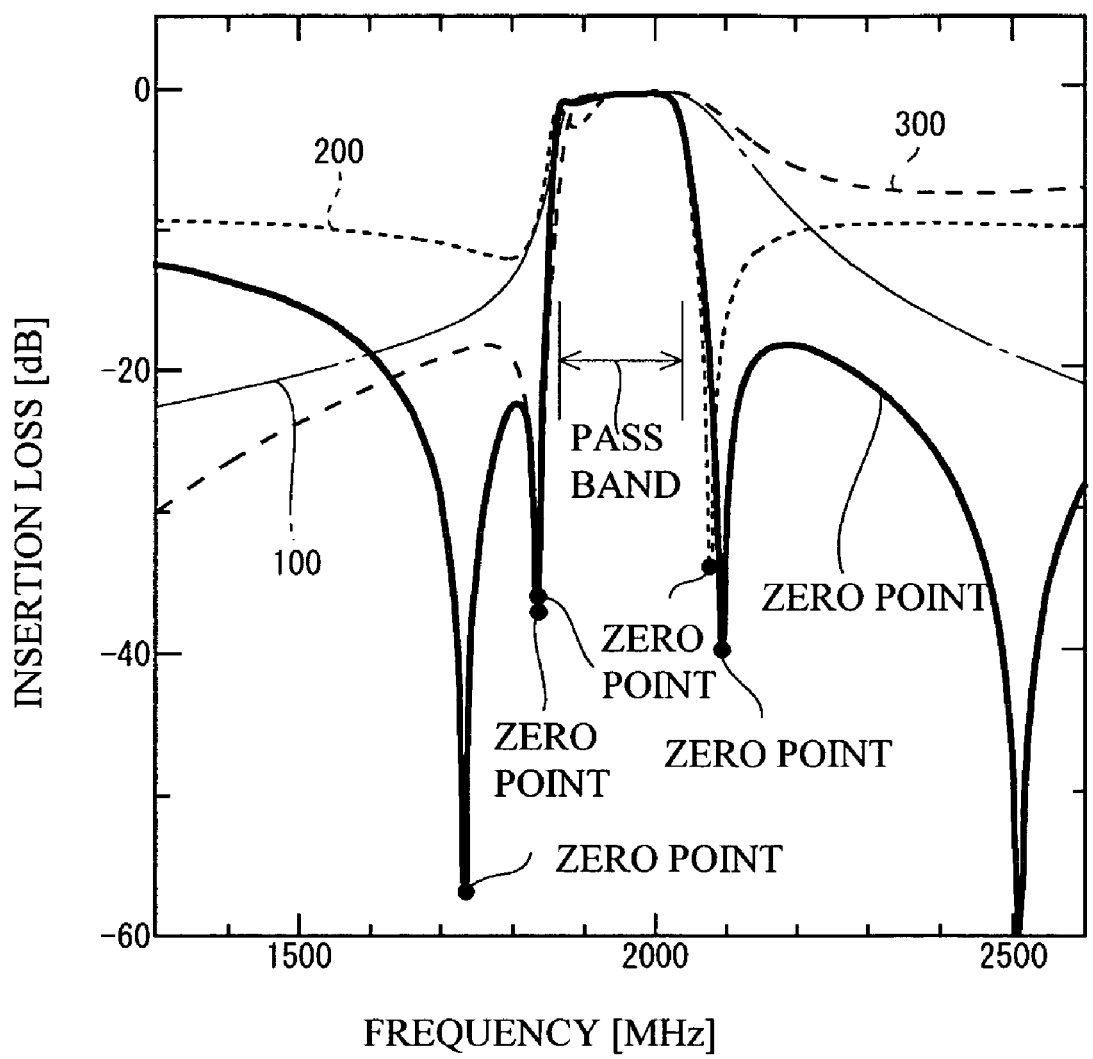
FIG. 10 is a graph collectively showing the filter characteristics of the conventional SAW filters of FIGS. 1A, 1B, and 3, and the filter characteristics of the SAW filter of FIG. 5.

As described above, in accordance with the present invention, the degree of suppression is increased both on the high frequency side and the low frequency side of the pass band by providing the capacitance C between the input terminal and the output terminal and attaching the inductance L to the ground terminals, and thus the degree of stop-band suppression is greatly improved. Furthermore, this increase in the degree of suppression is greater than the increase achieved in a case where only either the capacitance C or the inductance L is added. In this structure, the frequency of each zero point can be arbitrarily set by adjusting the values of the capacitance C and the inductance L. Accordingly, a surface acoustic wave filter with a great degree of freedom in design can be easily produced. For purposes of comparison, FIG. 10 collectively shows the filter characteristics of the conventional SAW filters 100, 200, and 300 shown in FIGS. 1A through 3, and the filter characteristics of the SAW filter 10A in accordance with the present invention. As is apparent from FIG. 10, the SAW filter 10A of the present invention exhibits a greater degree of suppression than any of the conventional SAW filters 100, 200, and 300, especially in the vicinities of the pass band. In this manner, the principles of the present invention can be applied to a SAW filter, so as to obtain a greater degree of stop-band suppression and better filter characteristics than a SAW filter that only has either the capacitance C or the inductance L.

Also, the present invention can be readily applied to various types of surface acoustic wave filters, such as a multi-electrode surface acoustic wave filter having two or more input IDTs and output IDTs, a double-mode surface acoustic wave filter having one input IDT and two output IDTs, and a laterally coupled resonator filter. Any of these filters in accordance with the present invention can exhibit excellent filter characteristics with a great degree of suppression and a steep cut-off profile.

Figure 11A:
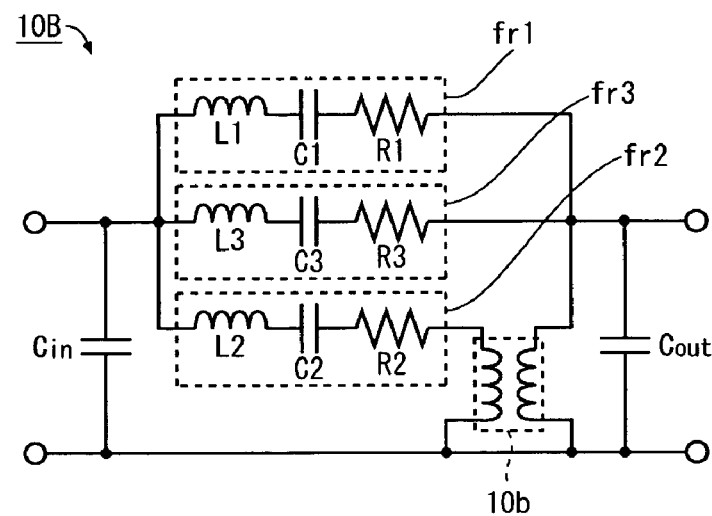
FIGS. 11A and 11B shows electric equivalent circuits of SAW filters each having three resonance frequencies in accordance with the present invention.
Figure 11B:
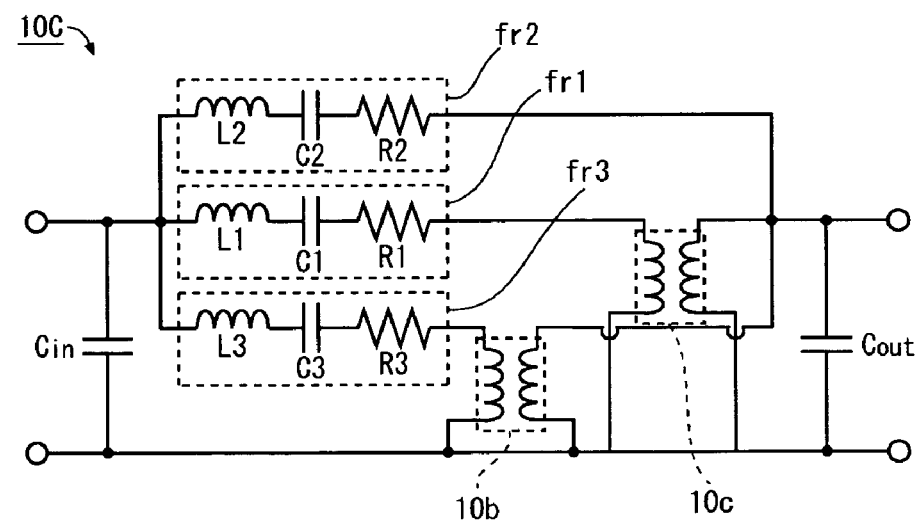

Standard SAW filters normally have resonance frequencies and exhibit band-pass characteristics, with pass bands being formed in the vicinities of the resonance frequencies. So as to form a pass band, the difference in pass phase (the phase of $S_{21}$) between two neighboring resonance frequencies needs to be approximately 180 degrees. Referring now to FIGS. 11A and 11B, the conditions for forming a pass band will be described.

FIG. 11A shows an electric equivalent circuit of a SAW filter 10B that has three resonance frequencies, for example. In FIG. 11A, the frequency that resonates with (L1, C1, R1) is denoted by fr1, the frequency that resonates with (L2, C2, R2) is denoted by fr2, and the frequency that resonates with (L3, C3, R3) is denoted by fr3. The relationship among those frequencies is expressed as: fr1<fr2<fr3.

As the resonance frequency fr2 comes through an "ideal transformer" 10b with a winding ratio of 1 to −1 in the structure shown in FIG. 11A, the pass phase of the frequency fr2 is 180 degrees. A resonance frequency having a pass phase of 180 degrees will be hereinafter referred to as the "reverse-phase resonance". The pass phase that defines the "reverse-phase resonance" does not have to be exactly 180 degrees, but is approximately 180 degrees. In the present invention, the pass phase may shift from 180 degrees, as long as desired characteristics can be obtained, because errors cannot be avoided in the process of actual production and design. The resonance frequencies fr1 and fr3 do not go through the above transformer, and accordingly, the pass phase of each of the resonance frequencies fr1 and fr3 is 0 degrees. A resonance frequency having a pass phase of 0 degrees will be hereinafter referred to as the "in-phase resonance". The pass phase that defines the "in-phase resonance" does not have to be exactly 0 degrees, but is approximately 0 degrees. In the present invention, the pass phase may shift from 0 degrees, as long as desired characteristics can be obtained, because errors cannot be avoided in the process of actual production and design. For ease of explanation, those errors will not be taken into consideration in the following description.

In the SAW filter 10B shown in FIG. 11A, the difference in pass phase between each two neighboring resonance frequencies is 180 degrees. More specifically, the difference in pass phase between the resonance frequencies fr1 and fr2 is 180 degrees, and the difference in pass phase between the resonance frequencies fr2 and fr3 is also 180 degrees. FIG.

11B shows an electric equivalent circuit of a SAW filter 10C that also has three resonance frequencies but has different resonance phases from the structure shown in FIG. 11A. In the SAW filter 10C shown in FIG. 11B, the resonance frequencies fr1 and fr3 represent reverse-phase resonances, and the resonance frequency fr2 represents an in-phase resonance. In this structure, the difference in pass phase between each two neighboring resonance frequencies is approximately 180 degrees, which also satisfies the conditions for forming a pass band.

As described above, an in-phase resonance and a reverse-phase resonance should alternately appear to form a pass band. In the structure shown in FIG. 11A, the resonances can be expressed as "In-Reverse-In" ("In" representing an in-phase resonance and "Reverse" representing a reverse-phase resonance), seen from the low frequency side. In the structure shown in FIG. 11B, the resonances can be expressed as "Reverse-In-Reverse", seen from the low frequency side.

So as to increase the degree of suppression in accordance with the present invention, the resonance of the lowest frequency and the resonance of the highest frequency need to be in-phase resonances. Therefore, it is necessary to have an odd number of resonance frequencies and to arrange the resonances in such an order as "In-Reverse-In" or "In-Reverse-In-Reverse-In". Since the structure shown in FIG. 11A has a resonance order of "In-Reverse-In", the SAW filter 10B satisfies the conditions for increasing the degree of suppression in accordance with the present invention. On the other hand, the structure shown in FIG. 11B has a resonance order of "Reverse-In-Reverse", and the SAW filter 10C cannot obtain the suppression increasing effect in accordance with the present invention.

Figure 12A:
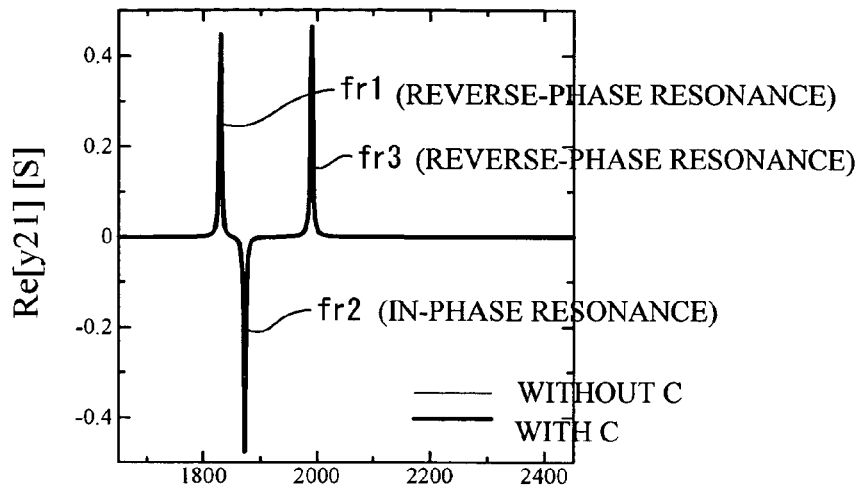
FIGS. 12A through 12C are graphs showing the changes in the real part and the imaginary part of $y_{21}$ and the changes in the band-pass characteristics that were caused by adding the capacitance C between the input terminal and the output terminal of the SAW filter of FIG. 11B.

Referring now to FIGS. 12A through 13C, the reason that a SAW filter having a resonance order of "Reverse-In-Reverse" cannot obtain the suppression increasing effect in accordance with the present invention will be explained. FIGS. 12A through 12C show the changes in the real part Re [$y_{21}$ (s)] and the imaginary part Im [$y_{21}$ (s)] of $y_{21}$ and the changes in the band-pass characteristics that were caused with the capacitance C provided between the input terminal and the output terminal in the SAW filter 10C having the resonance order of "Reverse-In-Reverse" shown in FIG. 11B. The results shown in FIGS. 12A through 12C were calculated based on the equivalent circuit shown in FIG. 11B. The results of the opposite case from this are shown in FIGS. 7A through 7C, which show the changes in the real part and the imaginary part of $y_{21}$ and the changes in the band-pass characteristics that were caused with the capacitance C provided between the input terminal and the output terminal in a SAW filter having a resonance frequency order of "In-Reverse-In".

Figure 12B:
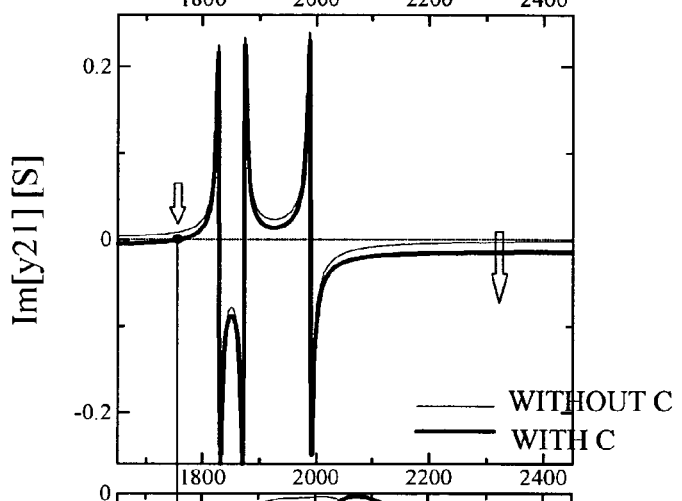
Figure 12C:
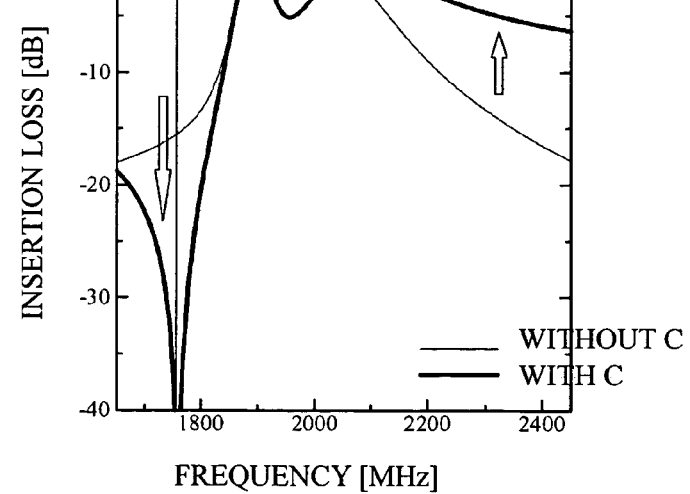

The changes in the real part and the imaginary part of $y_{21}$ shown in the graphs of FIGS. 12A and 12B, and the changes shown in the graphs of FIGS. 7A and 7B, are symmetrical with respect to the x-axis. Accordingly, the addition of the capacitance C reduces the imaginary part of $y_{21}$ and produces a zero point on the low frequency side of the pass band. However, the degree of suppression on the high frequency side of the pass band is reduced. Also, the pass band is greatly deformed in this structure, due to impedance mismatching.

Figure 13A:
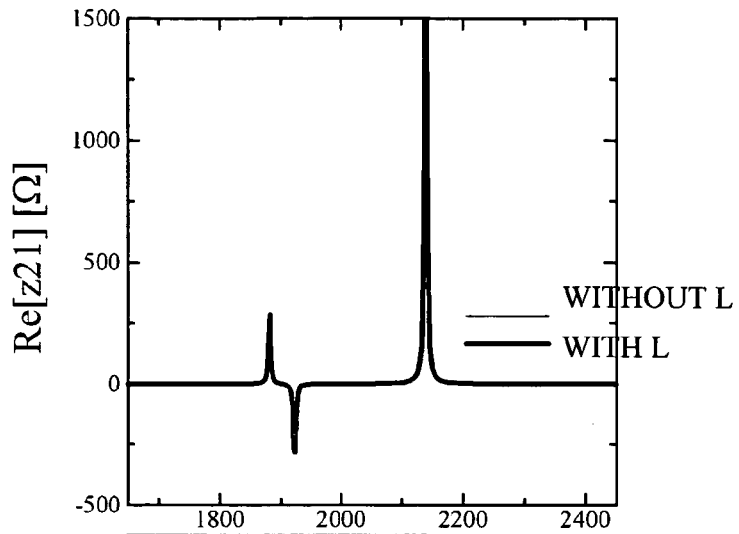
FIGS. 13A through 13C are graphs showing the changes in the real part and the imaginary part of $z_{21}$ and the changes in the band-pass characteristics that were caused by adding the inductance L to the ground terminal of the same SAW filter as the SAW filter of FIG. 11B already provided with the capacitance C between the input terminal and the output terminal.
Figure 13B:
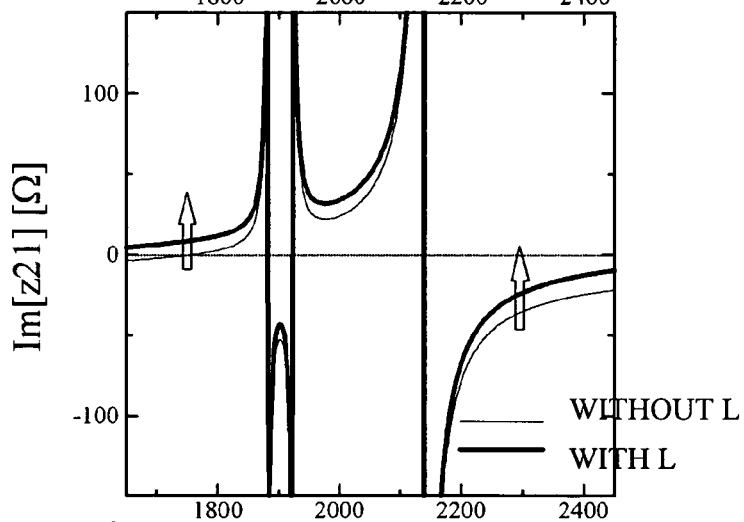
Figure 13C:
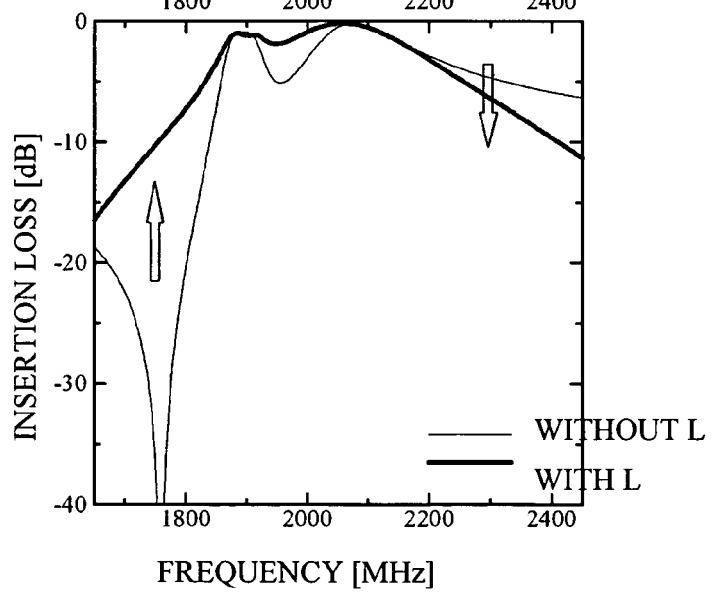

FIGS. 13A through 13C show the changes in the real part Re [$z_{21}$ (Ω)] and the imaginary part Im [$z_{21}$ (Ω)] of $z_{21}$ and the changes in the band-pass characteristics that were caused with the inductance L attached to the ground terminal in a SAW filter having the resonance order of "Reverse-In-Reverse" (like the SAW filter 10C of FIG. 11B) and the capacitance C provided between the input terminal and the output terminal. The results shown in FIGS. 13A through 13C were calculated based on the equivalent circuit shown in FIG. 11B. As is apparent from FIGS. 13A through 13C, the attachment of the inductance L to the ground terminal increases the imaginary part of $z_{21}$. Accordingly, the zero point on the low frequency side of the pass band disappears. On the other hand, the degree of suppression on the high frequency side of the pass band is slightly increased. However, the degree of suppression on the low frequency side and the high frequency side is smaller than the degree of suppression in the case without the capacitance C and the inductance L. Although the impedance matching is slightly improved, the shape of the pass band is more deformed than in the case without the capacitance C and the inductance L. For these reasons, a SAW filter having the resonance frequency order of "Reverse-In-Reverse" cannot obtain the suppression increasing effect in accordance with the present invention. Therefore, a SAW filter should have the resonance frequency order of "In-Reverse-In" in accordance with the present invention.

Also, so as to obtain the suppression increasing effect in accordance with the present invention, the lowest-frequency resonance and the highest-frequency resonance should be in-phase resonances, as already mentioned. Referring now to FIGS. 14A through 14H, the conditions for satisfying the above requirements will be described below. FIGS. 14A through 14H show double-mode SAW (DMS) filters each including one input IDT 11 (an input IDT 11a) and two output IDTs 11 (output IDTs 11b).

Each DMS filter has three resonance frequencies. First, the conditions for obtaining the resonance frequency order of "In-Reverse-In" will be described below. Although the input IDT 11a and the output IDTs 11b each has 2.5 pairs of electrode fingers in the following description, the number of pairs of electrode fingers is not limited to 2.5 in the present invention. Depending on the required configuration, the number of pairs of electrode fingers in each IDT can be varied in the range of 7 to 20, and other various modifications can be made. In most cases, the input IDT 11a has a different number of pairs from that of the output IDTs 11b. For purposes of simplification, a pair of SAW reflectors that are provided to sandwich the input IDT 11a and the output IDT 11b are not shown in each of FIGS. 14A through 14H.

In FIGS. 14A through 14D, either the electrode finger of each input IDT 11a that is the closest to an output IDT 11b or the electrode finger of the output IDT 11b that is the closest to the input IDT 11a is a ground electrode finger, and the other one, whichever is not the ground electrode finger, is a signal electrode finger. Here, the distance D (d) between the centers of the two electrode fingers are set within the range represented by the following expression (7):

$$\frac{\lambda}{4} < d < \frac{3\lambda}{4} \quad (7)$$

where λ is the wavelength of the surface acoustic wave at the center frequency of the pass band. The arrangements shown in FIGS. 14A through 14D will be hereinafter referred to as the "S-G" arrangements. Given the same parasitic impedances, all the arrangements shown in FIGS. 14A through 14D exhibit the same filter characteristics.

Figure 14A:
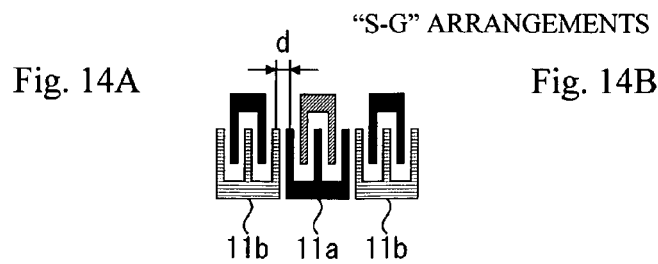
FIGS. 14A through 14H illustrate the conditions for achieving a structure in which the lowest-frequency resonance and the highest-frequency resonance are in-phase resonances in accordance with the present invention.
Figure 14B:
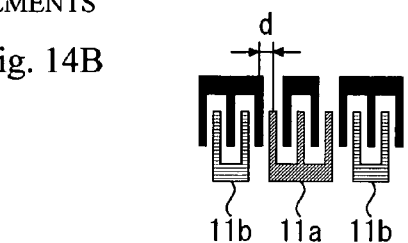
Figure 14C:
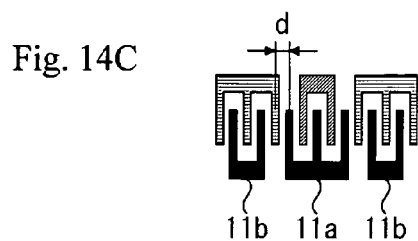
Figure 14D:
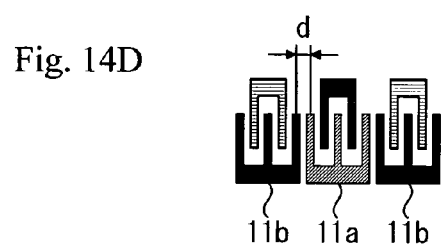
Figure 14E:
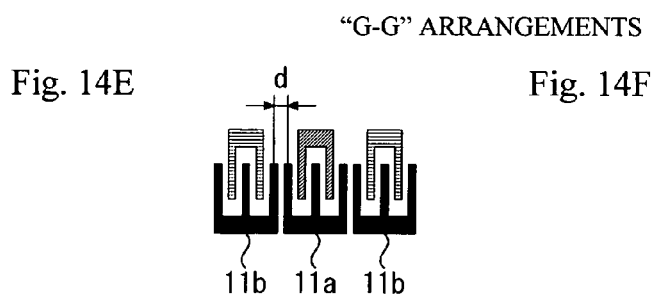
Figure 14F:
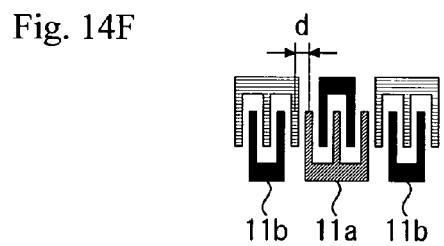
Figure 14G:
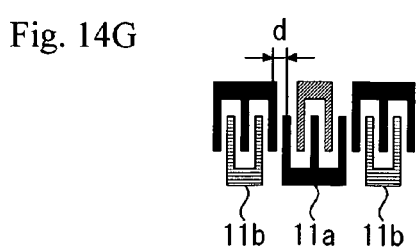
Figure 14H:
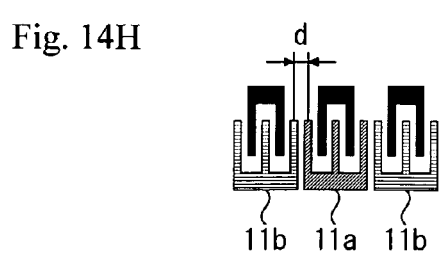

On the other hand, the arrangements shown in FIGS. 14E and 14G will be hereinafter referred to as the "G-G" arrangements, and the arrangements shown in FIGS. 14F and 14H will be hereinafter referred to as the "S-S" arrangements. In the "G-G" arrangements, the electrode finger of each input IDT 11a that is the closest to an output IDT 11b and the electrode finger of the output IDT 11b that is the closest to the input IDT 11a are both ground electrode fingers. In the "S-S" arrangements, the electrode finger of each input IDT 11a that is the closest to an output IDT 11b and the electrode finger of the output IDT 11b that is the closest to the input IDT 11a are both signal electrode fingers. Here, the distance D (d) between the centers of the two electrode fingers are also set within the range represented by the above expression (7). Given the same parasitic impedances, all the arrangements shown in FIGS. 14E through 14H exhibit the same filter characteristics.

The present inventors discovered, through simulations and experiments, that a "G-G" arrangement or a "S-S" arrangement is necessary to obtain the suppression increasing effect, because a DMS filter with a "G-G" arrangement or a "S-S" arrangement has the resonance order of "In-Reverse-In". On the other hand, a DMS filter with a "S-G" arrangement has the resonance order of "Reverse-In-Reverse", and cannot obtain the suppression increasing effect in accordance with the present invention.

Figure 15:
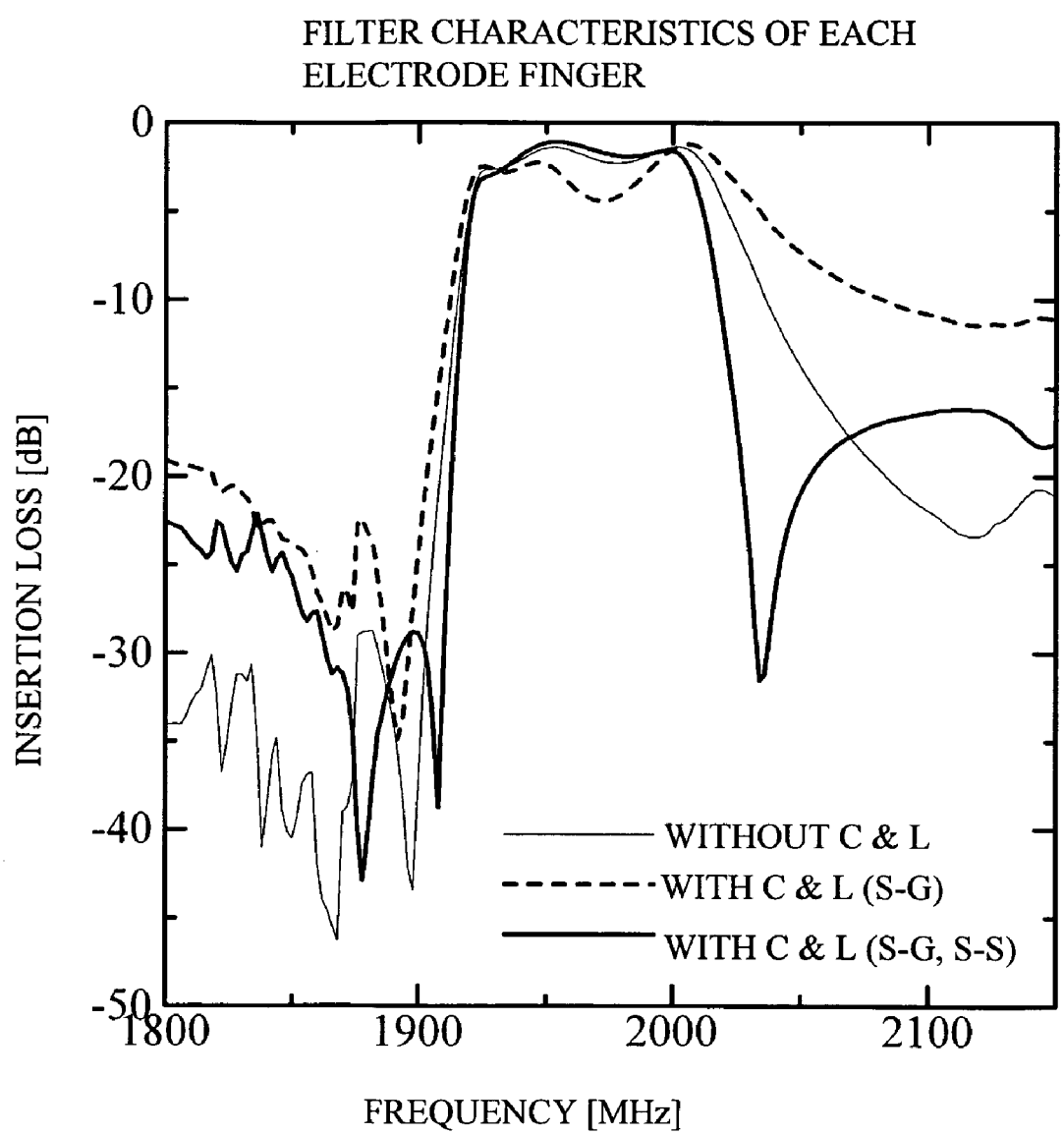
FIG. 15 is a graph showing the results of a experiment that was carried out on electrode finger arrangements to achieve the suppression increasing effect in accordance with the present invention.

FIG. 15 shows the results of experiments that were carried out on electrode finger arrangements to obtain the suppression increasing effect in accordance with the present invention. In the graph shown in FIG. 15, the fine line indicates the band-pass characteristics of a DMS filter that has neither the capacitance C nor the inductance L. The bold line indicates the band-pass characteristics of a DMS filter that has both the capacitance C and the inductance L with a "G-G" electrode finger arrangement or a "S-S" electrode finger arrangement. Further, the broken line indicates the band-pass characteristics of a DMS filter that has both the capacitance C and the inductance L with a "S-G" electrode finger arrangement.

As is apparent from FIG. 15, the DMS filter with a "G-G" electrode finger arrangement or a "S-S" electrode finger arrangement exhibits an increased degree of suppression, having the resonance order of "In-Reverse-In" and producing a zero point in the vicinity of the pass band. On the other hand, the DMS filter with a "S-G" electrode finger arrangement exhibits a poor degree of stop-band suppression, having the resonance order of "Reverse-In-Reverse". Also, the shape of the pass band of this DMS filter is deformed due to impedance mismatching.

Referring now to FIGS. 16A through 16H, modifications of the "S-G" arrangements, the "G-G" arrangements, and the "S-S" arrangements, will be described. As shown in FIGS. 16A through 16D, when the distance D between electrode centers is $d+\lambda/2$, a DMS filter with a "S-G" arrangement can have a pass phase of 180 degrees and the resonance order of "In-Reverse-In". It became apparent through simulations that, if the distance D between electrode centers is $d+\lambda/2$, the degree of suppression can be increased with the capacitance C and the inductance L, as shown by the bold line in FIG. 15, even in a DMS filter with a "S-G" arrangement. Also, a DMS filter has such a property that the distance D exhibits the same characteristics at intervals of A, and a "S-G" arrangement can be employed as long as the distance D is $d+\lambda/2+n\lambda$ (n being an integer). Accordingly, the distance D should be set within the range represented by the following expression (2):

$$\frac{3\lambda}{4} + n\lambda < D < \frac{5\lambda}{4} + n\lambda \quad (2)$$

Likewise, the distance D exhibits the same characteristics at intervals of λ in a "G-G" arrangement or a "S-S" arrangement. Therefore, the distance D should be set within the range represented by the following expression (1):

$$\frac{\lambda}{4} + n\lambda < D < \frac{3\lambda}{4} + n\lambda \quad (1)$$

The following is a description of embodiments of the present invention based on the above described principles.

(First Embodiment)

A first embodiment of the present invention will now be described below, with reference to the accompanying drawings.

Figure 17A:
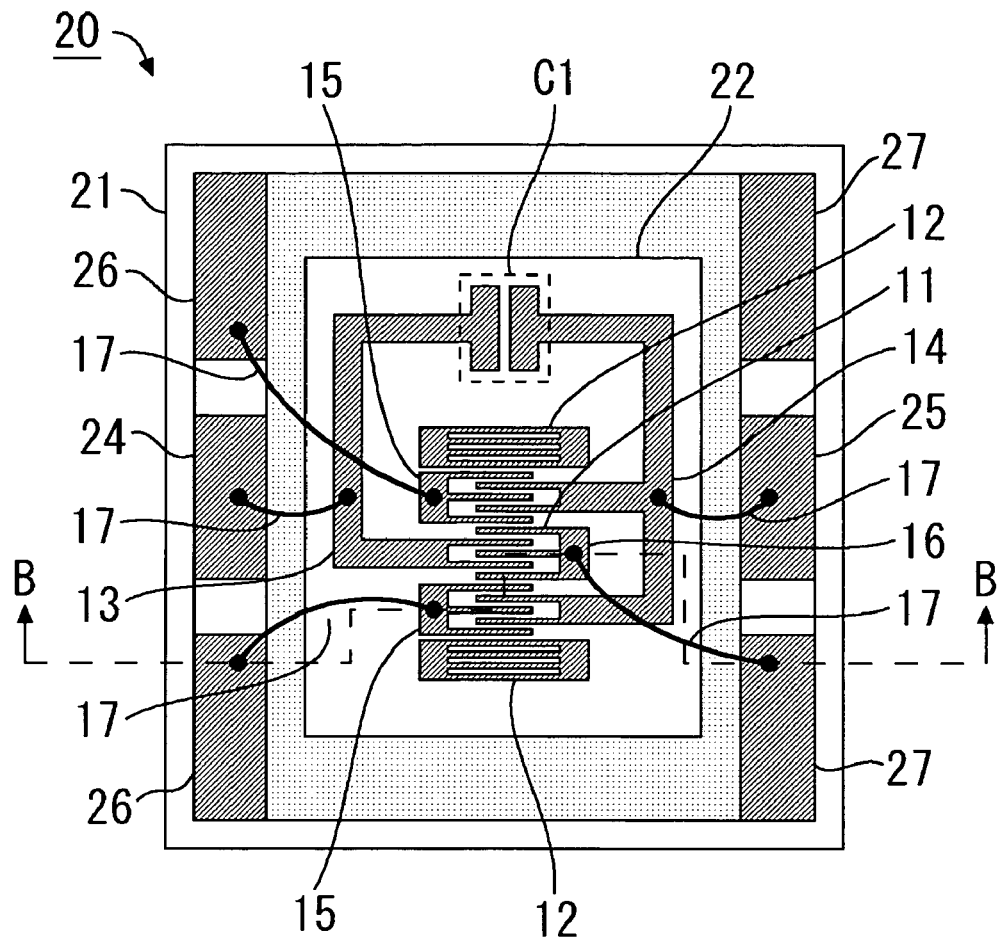
FIG. 17A is a top view of a SAW filter in accordance with a first embodiment of the present invention.
Figure 17B:
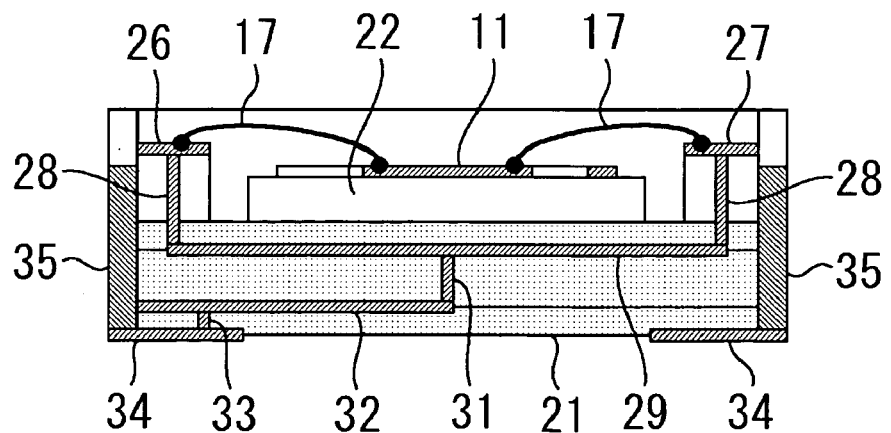
FIG. 17B is a section view of the SAW filter, taken along the line B—B of FIG. 17A.

FIGS. 17A and 17B illustrate the structure of a SAW filter 20 in accordance with this embodiment. FIG. 17A is a top view of the SAW filter 20. FIG. 17B is a section view of the SAW filter 20, taken along the line B—B of FIG. 17A. In this embodiment, the SAW filter 20 is a DMS filter that has one IDT 11 on the input side and two IDTs 11 on the output side.

As shown in FIGS. 17A and 17B, the SAW filter 20 has a SAW device accommodated in the cavity of a package 21. The SAW device has reflectors 12 that are formed on a piezoelectric substrate 22 and sandwich the IDTs 11 in the SAW propagating direction. In the SAW device, the electrode at one end of the IDT 11 located on the input side is connected to an input terminal 13 having the same layer structure as the corresponding electrode. Likewise, the electrode at the other end of the IDT 11 located on the input side is connected to a ground terminal 16 having the same layer structure as the corresponding electrode. Also, the electrode at one end of each IDT 11 located on the output side is connected to an output terminal 14 having the same layer structure as the corresponding electrode. Likewise, the electrode at the other end of each IDT 11 located on the output side is connected to a ground terminal 15 having the same layer structure as the corresponding electrode.

In the above structure of this embodiment, the output terminal 14 is shared between the two output IDTs 11. The opposite end of the input terminal 13 from the IDT 11 and the opposite end of the output terminal 14 from the IDTs 11 are located close to each other on the piezoelectric substrate 22, and thus form a capacitance C1.

The package 21 is made of a substrate material such as ceramics, aluminum ceramics, bismaleimide-triazine resin, polyphenylene ether, polyimide resin, glass epoxy, glass cloth, or silicon, and has a structure formed by laminating substrates. The piezoelectric substrate 22 may be a 42° rotated Y-cut X-propagation lithium tantalate single-crystal piezoelectric substrate (hereinafter referred to as the LT substrate), a 64° rotated Y-cut X-propagation lithium niobate single-crystal piezoelectric substrate (hereinafter referred to as the LN substrate), or a piezoelectric substrate made of a piezoelectric material such as crystal. If the LT substrate is employed, for example, the filter characteristics show low insertion loss. The IDTs 11, and the input terminal 13, the output terminal 14, and the ground terminals 15 and 16, which are integrally formed with the IDTs 11, contain aluminum (Al), copper (Cu), gold (Au), molybdenum (Mo), tungsten (W), tantalum (Ta), chromium (Cr), titanium (Ti), platinum (Pt), ruthenium (Ru), or rhodium (Rh) as a main component, and have single- or multi-layer structure made of one or more of those materials.

The input terminal 13 is connected to an input pad 24 with a bonding wire 17. The output terminal 14 is connected to an output pad 25 with a bonding wire 17. Each of the ground terminals 15 is connected to an output ground pad 26 with a bonding wire 17. The ground terminal 16 is connected to an input ground pad 27 with a bonding wire 17. In this embodiment, the SAW device is face-up mounted to the package 21, and those components are wire-bonded to one another. Each of the bonding wires 17 is made of a metal material such as aluminum (Al), copper (Cu), or gold (Au).

The output ground pads 26 and the input ground pads 27 are connected to a common ground terminal 29 in the package 21 with vias 28 extending within the package 21, so that the output ground pads 26 and the input ground pads 27 are connected to one another. The common ground terminal 29 is a transmission line path that is connected to a ground foot pattern 34 through a via 31, a transmission line path 32 connected to the via 31, and a via 33. The ground foot pattern 34 is formed on the bottom face of the package 21 (with the cavity face being the upper face). Also, the connection to the ground foot pattern 34 may be established through castellations 35 formed on the side faces of the package 21 (provided with plating on the surface), as shown in FIG. 17B. At least one of the vias 31 and 33, the transmission line path 32, and the castellations 35, is designed to form the above mentioned inductance L.

The input pad 24 and the output pad 25 are also connected to an external input foot pattern, an output foot pattern, or the like, through vias or transmission line paths that are not shown in the figures. Foot patterns 34 are provided on the bottom of the package 21.

With the above structure, the degree of suppression is increased both on the high frequency side and the low frequency side of the pass band. In other words, the degree of stop-band suppression is greatly improved. Further, the increase of the suppression is larger both on the low frequency side and the high frequency side than the increase achieved in a case where only either the capacitance C or the inductance L is added. In this structure, the frequency of the zero point can be arbitrarily set by adjusting the values of the capacitance C and the inductance L. Accordingly, a surface acoustic wave filter with a great degree of freedom in design can be easily produced.

Although the above described capacitance C (C1 in FIG. 17A) is formed by the ends of the input terminal 13 and the output terminal 14 formed on the piezoelectric substrate 22, the present invention is not limited to that structure. For example, it is also possible to employ the same structure as the IDTs 11 or a three-dimensional structure that sandwiches a dielectric film.

Further, the ground terminals 15 and 16 are connected in the package 21 in the above description. However, the present invention is not limited to that structure, and may employ a structure in which the ground terminals 15 and 16 are connected on the piezoelectric substrate 22 or outside the package 21 (on the bottom surface of the package 21, for example).

Figure 1B:
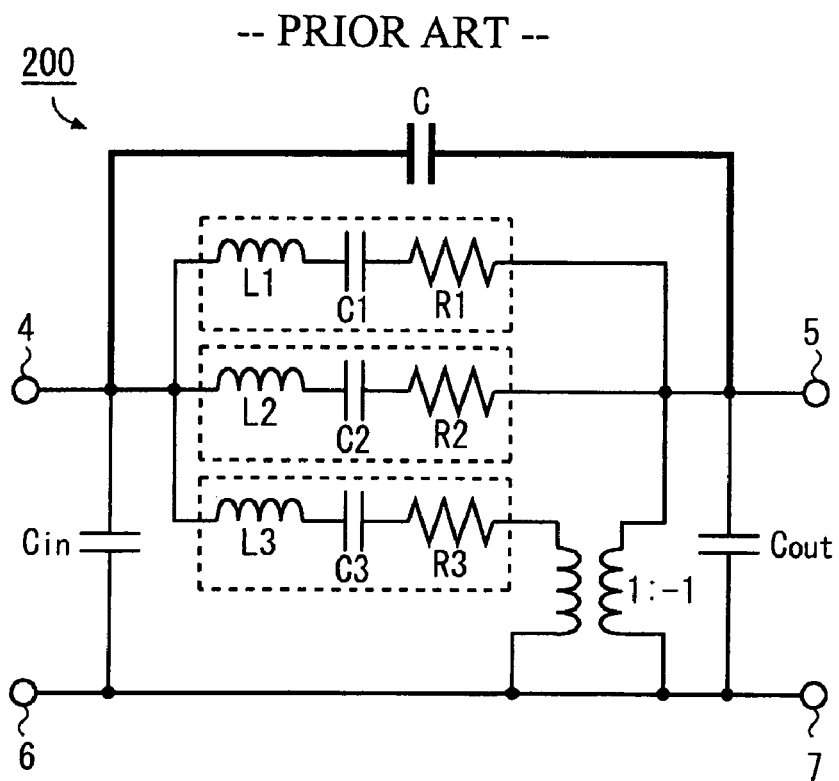
FIG. 1B shows an equivalent circuit of a conventional SAW filter in accordance with Prior Art 1.
Figure 2:
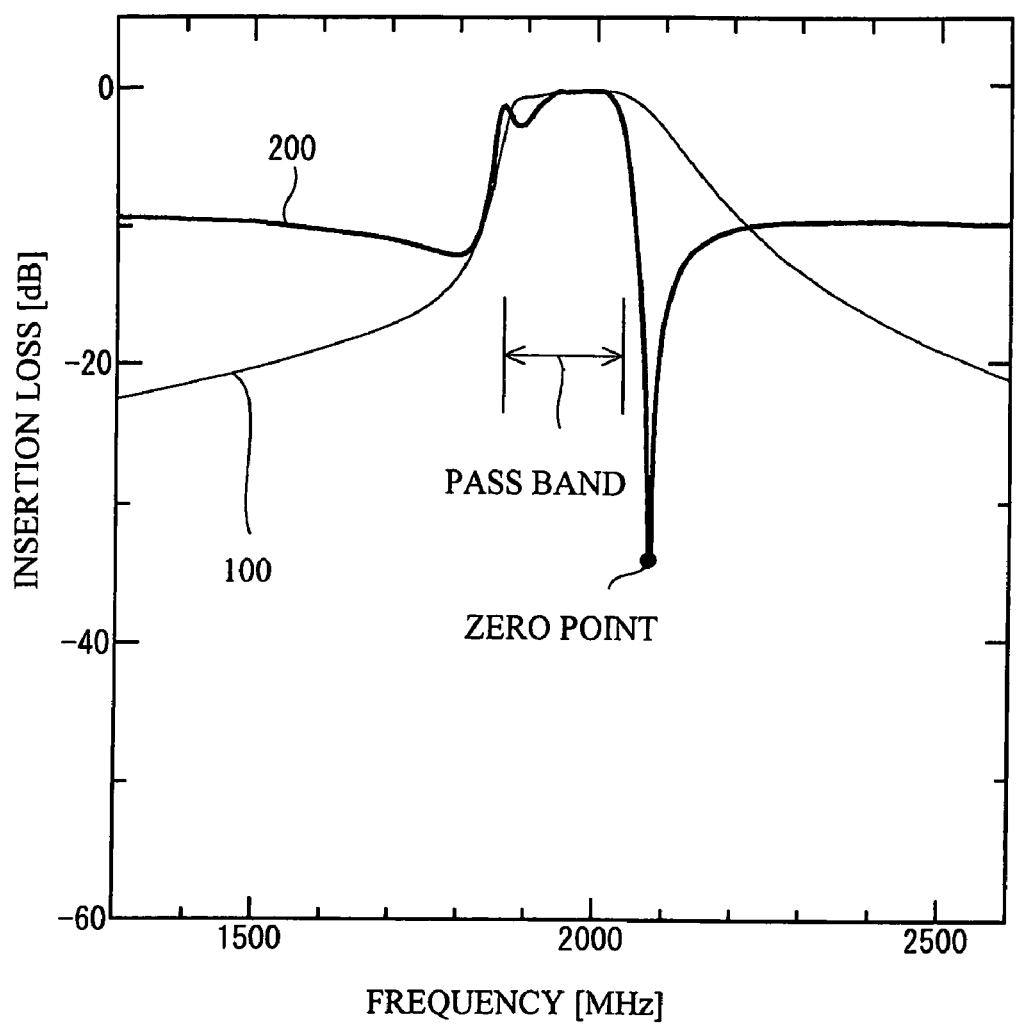
FIG. 2 is a graph showing the band-pass characteristics of the SAW filters of FIGS. 1A and 1B.
Figure 3:
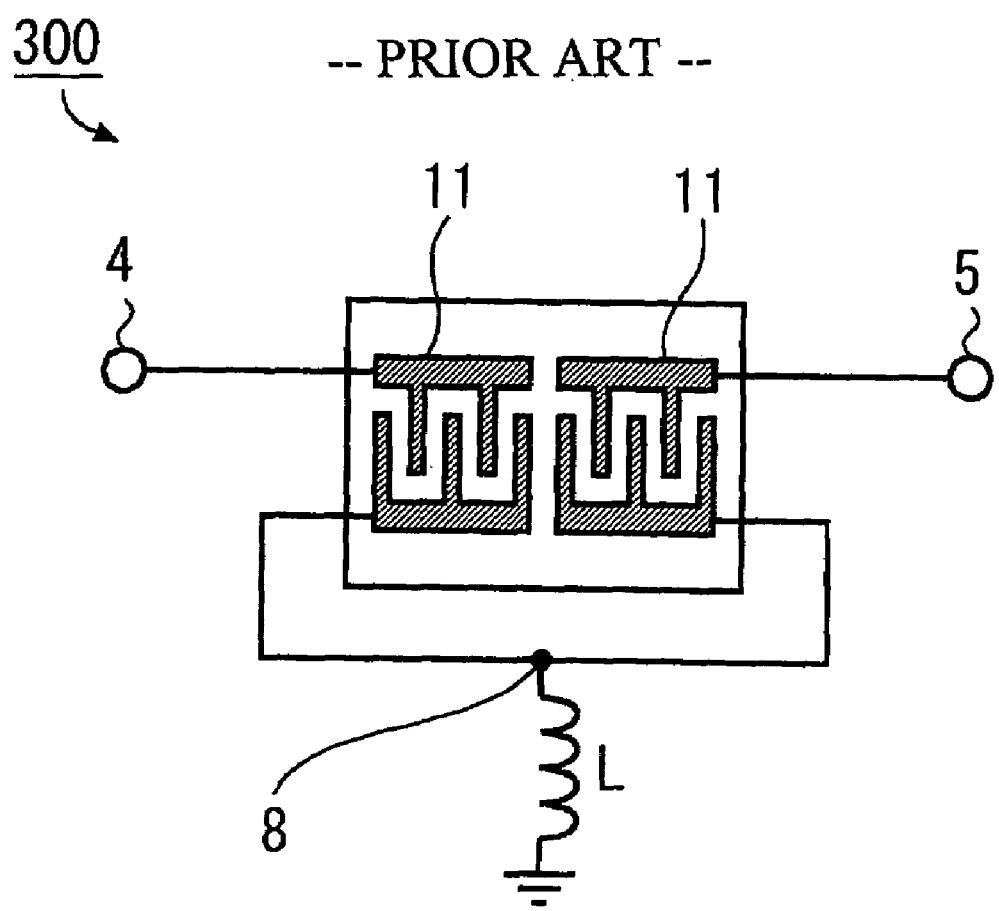
FIG. 3 shows an equivalent circuit of a conventional SAW filter in accordance with Prior Art 2.
Figure 4:
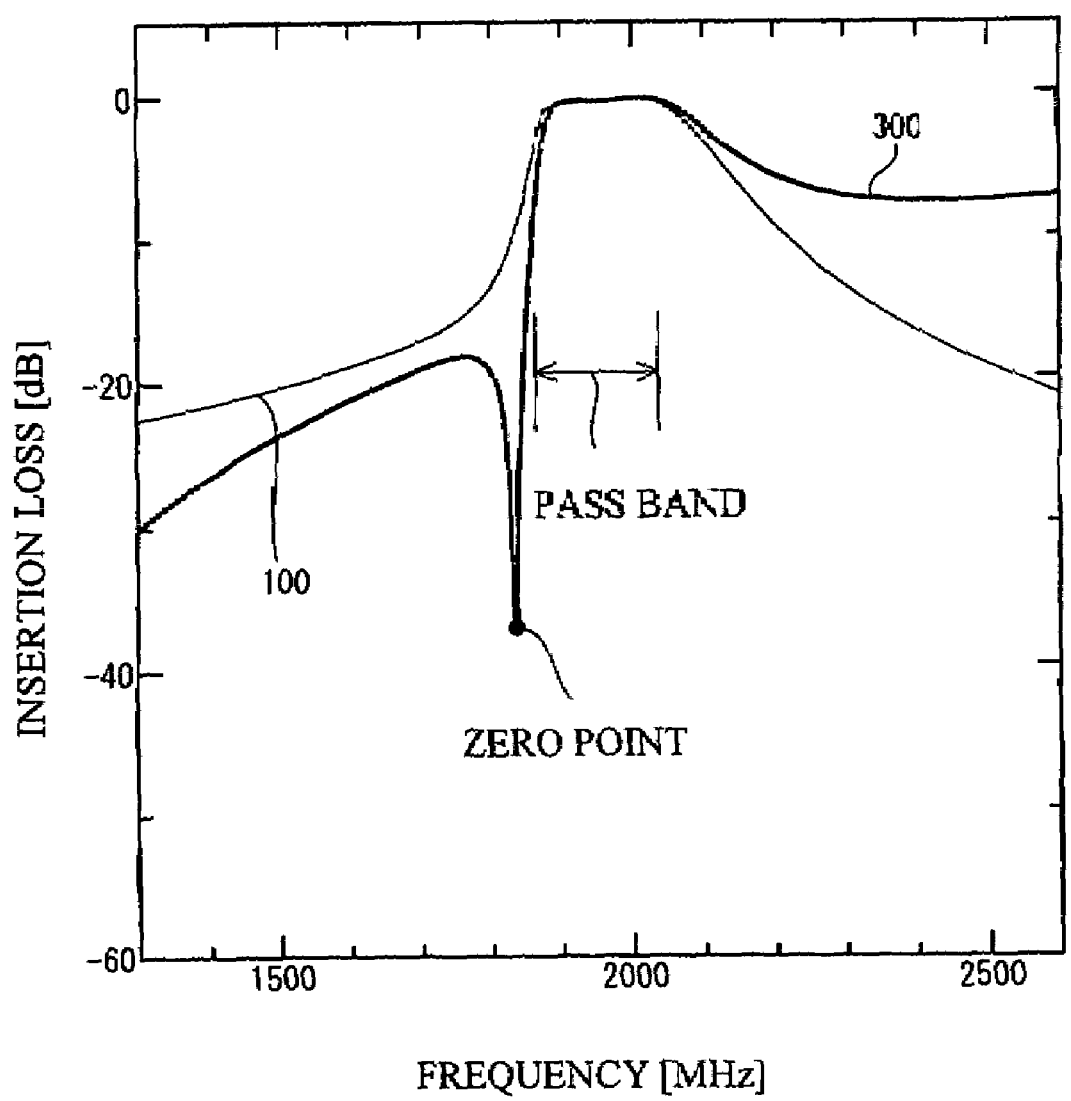
FIG. 4 is a graph showing the band-pass characteristics of the SAW filter of FIG. 1A and the SAW filter of FIG. 3.
Figure 18A:
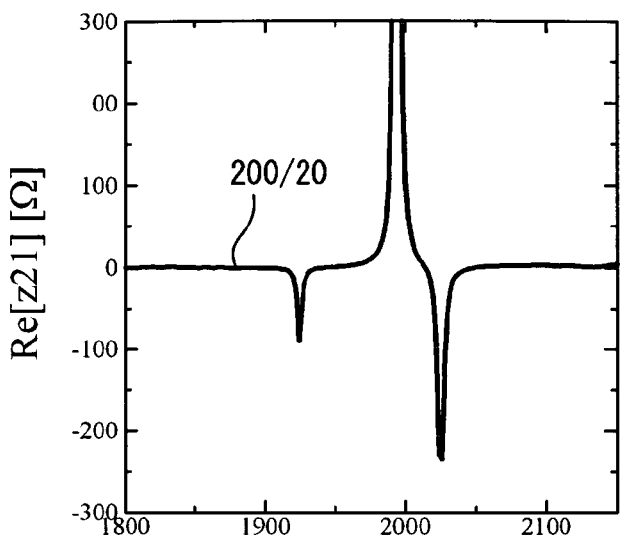
FIGS. 18A–18C are graphs showing the comparison between the filter characteristics of the SAW filter in accordance with the first embodiment and the filter characteristics of a conventional SAW filter having a capacitance C but not having an inductance L.
Figure 18B:
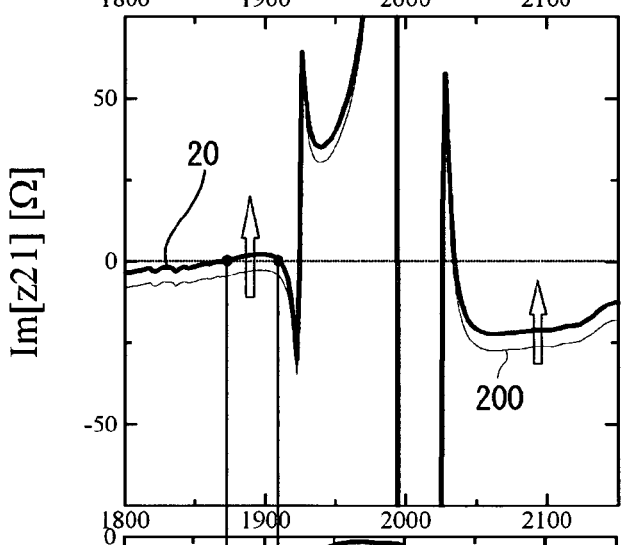
Figure 18C:
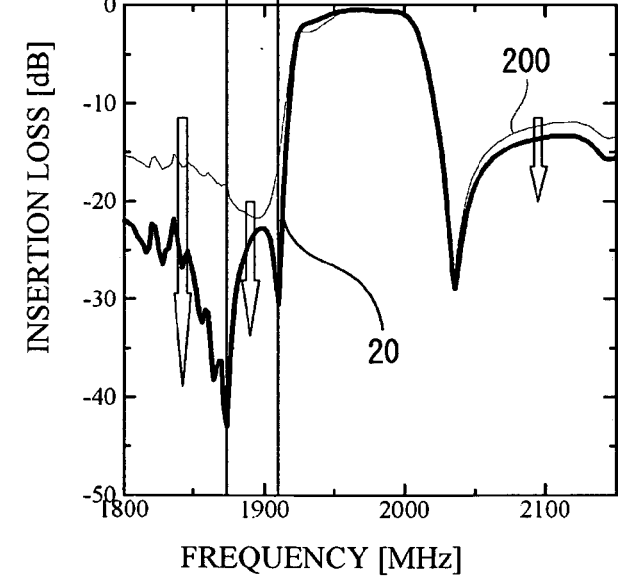

Referring now to FIGS. 18A through 18C, the filter characteristics of the SAW filter 20 of this embodiment will be compared with the filter characteristics of a conventional SAW filter having only the capacitance C but not having the inductance L (for example, the SAW filter 200 shown in FIG. 1B). FIG. 18A shows the frequency characteristics of the real part Re ($z_{21}$ [Ω]) of each $z_{21}$ of the SAW filters 200 and 20. FIG. 18B shows the frequency characteristics of the imaginary part Im ($z_{21}$ [Ω]) of each $z_{21}$ of the SAW filters 200 and 20. FIG. 18C shows the filter characteristics of the SAW filters 200 and 20. In these graphs, the arrows indicate the shifting directions of the impedance characteristics and the filter characteristics of the SAW filter 20 with respect to the impedance characteristics and the filter characteristics of the SAW filter 200. In FIG. 18C, a downward arrow indicates an increase in the degree of suppression, while an upward arrow indicates a decrease in the degree of suppression.

As shown in FIGS. 18A through 18C, the inductance L added to the common ground terminal 8 increased the imaginary part of $z_{21}$, and produced the frequencies having the imaginary part of $z_{21}$ at zero in the vicinities of 1870 MHz and 1910 MHz. At these frequencies, the real part of $z_{21}$ was also approximately zero, and accordingly, the absolute value of $z_{21}$ became approximately zero. Thus, zero points appeared in the band-pass characteristics. Further, as the absolute value of the imaginary part of $z_{21}$ was reduced on the high frequency side of the pass band, the degree of suppression was improved.

As mentioned in the description of the principles of the present invention, this embodiment is designed so that both the lowest resonance frequency and the highest resonance frequency are "in-phase resonance" frequencies. With this structure, the above described effects can be certainly achieved. Also, the electrode center distance D is set within the range represented by the expressions 7 and 2.

(Second Embodiment)

Figure 19A:
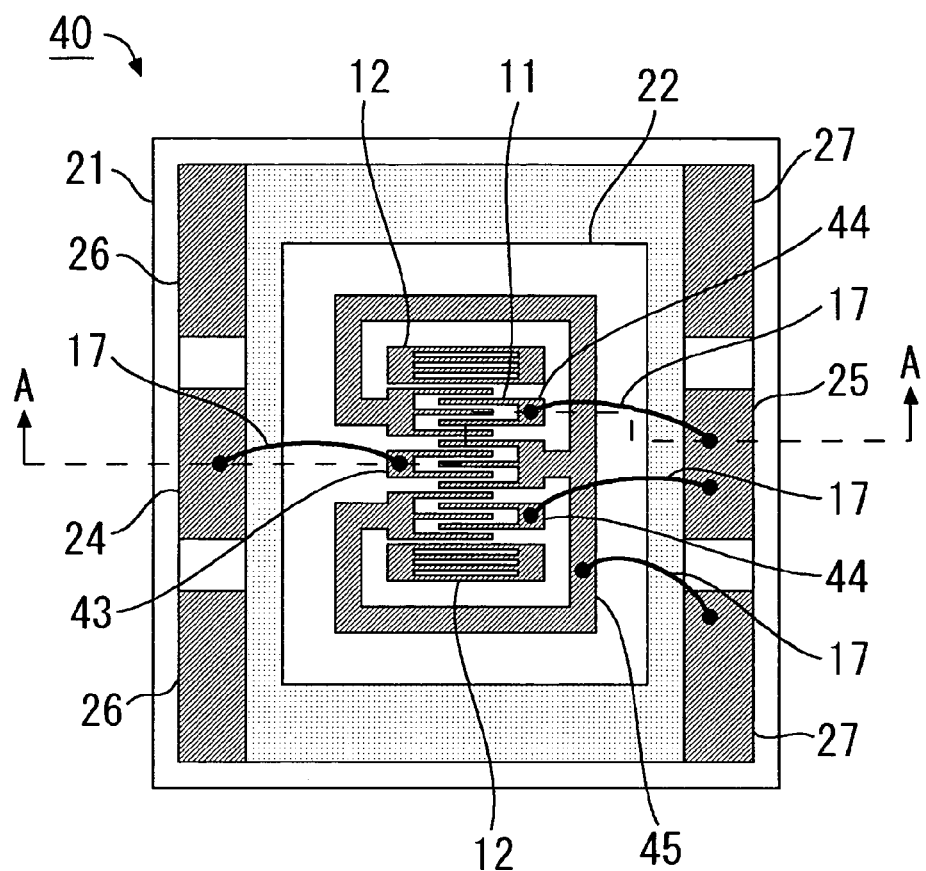
FIG. 19A is a top view of a SAW filter in accordance with a second embodiment of the present invention.
Figure 19B:
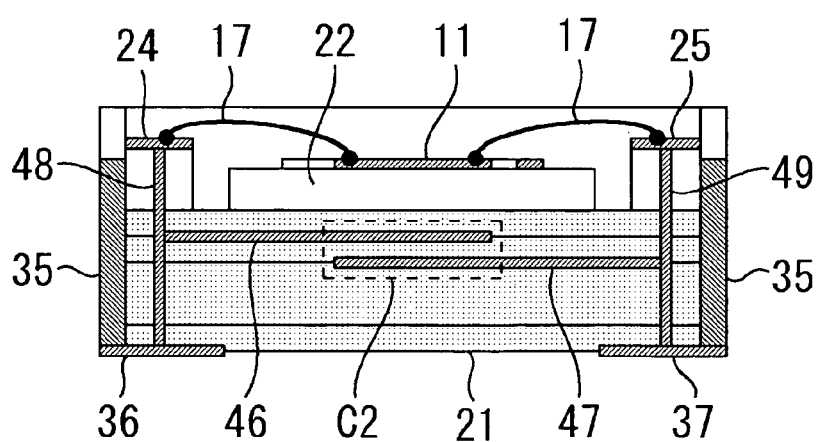
FIG. 19B is a section view of the SAW filter, taken along the line A—A of FIG. 19A.

A second embodiment of the present invention will now be described in detail, with reference to the accompanying drawings. This embodiment is a first modification of the double-mode SAW (DMS) filter (the SAW filter 20 of the first embodiment) that includes one IDT 11 on the input side and two IDTs on the output side. FIGS. 19A and 19B illustrate the structure of a SAW filter 40 in accordance with this embodiment. FIG. 19A is a top view of the SAW filter 40. FIG. 19B is a section view of the SAW filter 40, taken along the line A—A of FIG. 19A.

As shown in FIGS. 19A and 19B, the SAW filter 40 has a structure in which the ground terminals 15 and 16 of the first embodiment are connected to form a common ground terminal 45 that is connected to one of the input ground pads 27 or the output ground pads 26 with a bonding wire 17. In FIG. 19A, the common ground terminal 45 is connected to one of the input ground pads 27. Also, the capacitance C1, which is formed between the input terminal 13 and the output terminal 14 in the first embodiment, is formed within the package 21 in this embodiment. This structure can be realized by forming a transmission line path 46 that is connected to the input pad 24 through a via 48, and a transmission line path 47 that is connected to the output pad 25 through a via 49, and then bringing these transmission line paths 46 and 47 close to each other. In doing so, another layer is interposed between the transmission line paths 46 and 47 in the package 21, or the transmission line paths 46 and 47 are placed on the same layer in the package 21.

Further, in this embodiment, the inductance L connected to the common ground terminal 45 is formed by at least one of the following components: the bonding wires 17, a via having the same structure as the via 49 extending from one of the input ground pads 27 into the package 21, and the castellations 35. The vias connected to the input and output ground pads 27 and 26 are connected to the ground foot pattern 34, penetrating through the package 21. As the common ground terminal 45 is formed on the piezoelectric substrate 22, the wiring distance to the ground foot pattern can be made longer. Accordingly, the value of the inductance L can also be made greater.

With the above structure of this embodiment, the degree of suppression is increased both on the high frequency side and the low frequency side of the pass band in the same way as in the first embodiment. Furthermore, the increase in the degree of suppression is greater than the increase achieved in a case where only either the capacitance C or the inductance L is added. Accordingly, a surface acoustic wave filter that exhibits a greater degree of suppression both on the high frequency side and the low frequency side can be realized. In this structure, the frequency of each zero point can be arbitrarily set by adjusting the values of the capacitance C and the inductance L. Accordingly, a surface acoustic wave filter with a great degree of freedom in design can be easily produced. The other aspects of this embodiment are the same as those of the first embodiment, and therefore, explanation of them is omitted herein.

(Third Embodiment)

Figure 20A:
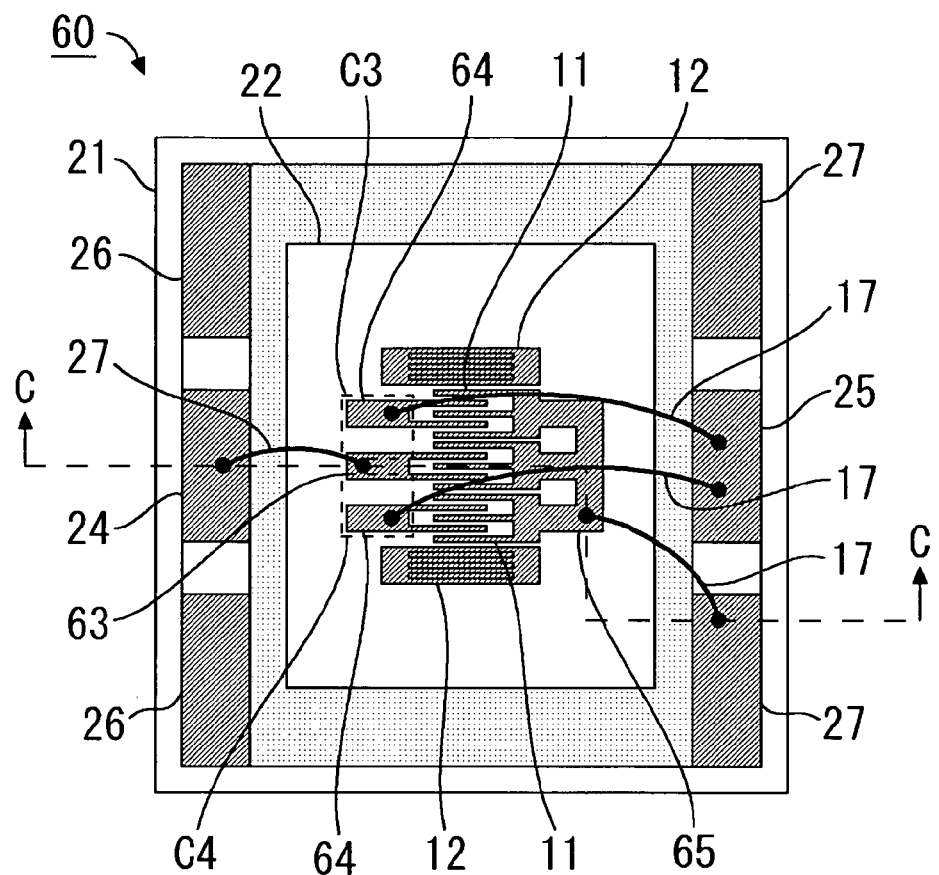
FIG. 20A is a top view of a SAW filter in accordance with a third embodiment of the present invention.
Figure 20B:
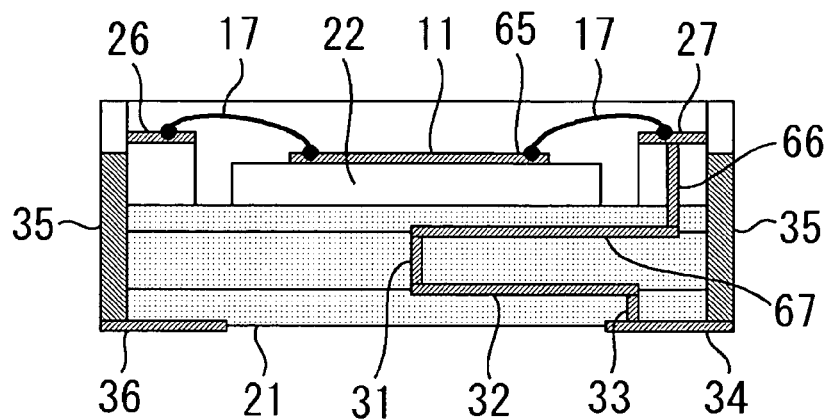
FIG. 20B is a section view of the SAW filter, taken along the line C—C of FIG. 20A.

A third embodiment of the present invention will now be described in detail, with reference to the accompanying drawings. This embodiment is a second modification of the double-mode SAW (DMS) filter (the SAW filter 20 of the first embodiment) that includes one IDT 11 on the input side and two IDTs on the output side. FIGS. 20A and 20B illustrate the structure of a SAW filter 60 in accordance with this embodiment. FIG. 20A is a top view of the SAW filter 60. FIG. 20B is a section view of the SAW filter 60, taken along the line C—C of FIG. 20A.

As shown in FIGS. 20A and 20B, the SAW filter 60 has a structure in which the ground terminals 15 and 16 of the first embodiment are connected to form a common ground terminal 65 that is connected to one of the input ground pads 27 or the output ground pads 26 with a bonding wire 17. In FIG. 20A, the common ground terminal 65 is connected to one of the input ground pads 27. In this embodiment, the input IDT 11 and the output IDTs 11 have the respective ground electrode fingers extending in the same direction. With this arrangement, capacitances C3 and C4 are formed between the respective bus bars that constitute an input terminal 63 and output terminals 64. Also, the bus bars of the input terminal 63 and the output terminals 64 can easily produce the small-sized capacitances C3 and C4 on the piezoelectric substrate 22.

Further, in this embodiment, the inductance L connected to the common ground terminal 65 is formed by at least one of the following components: the bonding wires 17, a via 66, a transmission line path 67, the via 31, the transmission line path 32, the via 33, and the castellations 35. As the common ground terminal 65 is formed on the piezoelectric substrate 22, the wiring distance to the ground foot pattern 34 can be made longer. Accordingly, the value of the inductance L can also be made greater. The employment of the transmission line path 67 extending horizontally in the package 21, as shown in FIG. 20B, is effective in any structure to elongate the wiring distance between the common ground terminal 65 and the ground foot pattern 34.

With the above structure of this embodiment, the degree of suppression is increased both on the high frequency side and the low frequency side of the pass band in the same way as in the first embodiment, and thus the degree of stop-band suppression is greatly increased. Furthermore, the increase in the degree of suppression is greater than the increase achieved in a case where only either the capacitance C or the inductance L is added. Accordingly, a surface acoustic wave filter that exhibits a greater degree of suppression both on the high frequency side and the low frequency side can be realized. In this structure, the frequency of each zero point can be arbitrarily set by adjusting the values of the capacitance C and the inductance L. Accordingly, a surface acoustic wave filter with a great degree of freedom in design can be easily produced. The other aspects of this embodiment are the same as those of the first embodiment, and therefore, explanation of them is omitted herein.

Figure 21A:
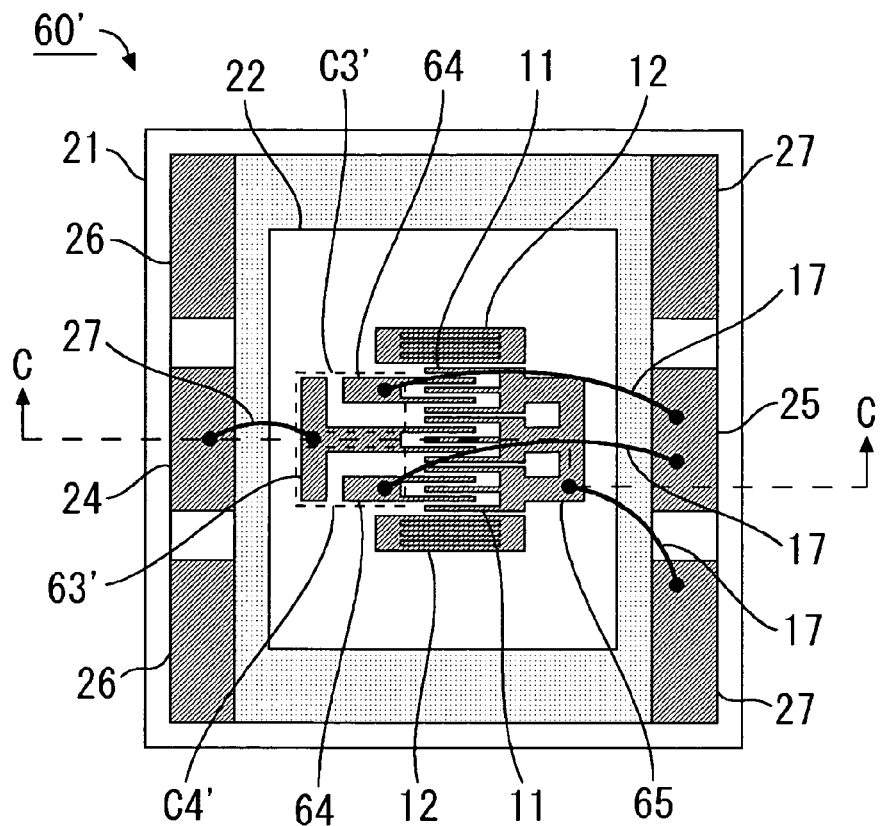
FIG. 21A is a top view of a modification of the SAW filter in accordance with the third embodiment of the present invention.
Figure 21B:
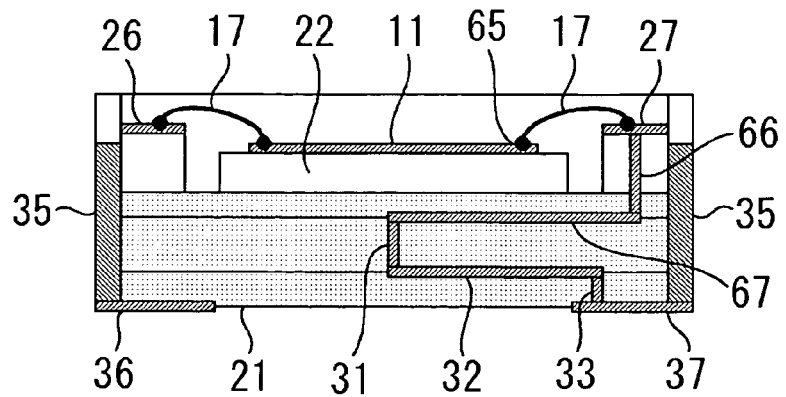
FIG. 21B is a section view of the modification of the SAW filter, taken along the line C—C of FIG. 21A.

The SAW filter 60 of this embodiment may be modified as shown in FIGS. 21A and 21B. More specifically, the opposite end of the bus bar of the input terminal 63 from the electrode fingers is formed in a T-shape, so that the capacitances C3' and C4' formed with the input terminal 63' and the output terminals 64 become larger.

(Fourth Embodiment)

Figure 22A:
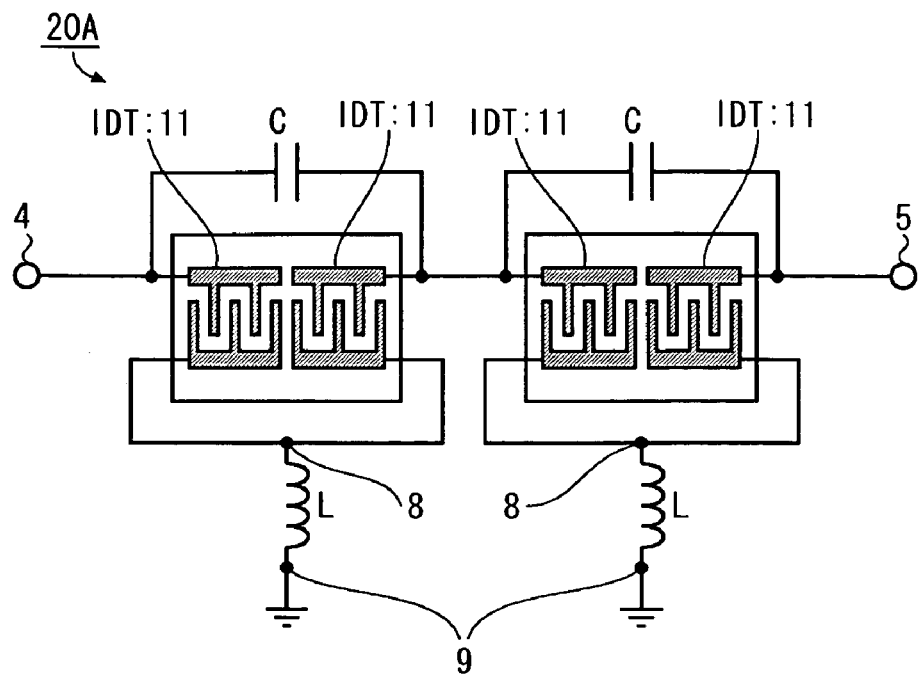
FIGS. 22A and 22B are circuit diagrams of SAW filters in accordance with a fourth embodiment of the present invention.
Figure 22B:
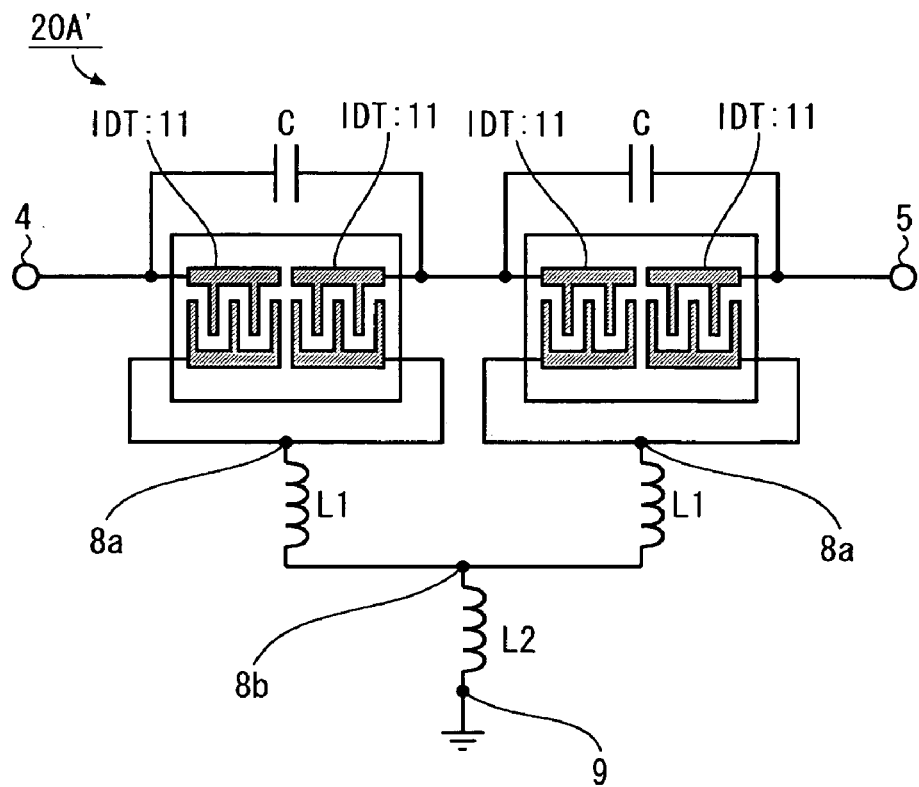

A fourth embodiment of the present invention will now be described in detail, with reference to the accompanying drawings. This embodiment is an example case where two SAW filters 10A in accordance with the principles of the present invention are cascade-connected. FIGS. 22A and 22B are circuit diagrams of SAW filters 20A and 20A' in accordance with this embodiment.

More specifically, FIG. 22A shows an equivalent circuit of the SAW filter 20A that is formed by connecting two SAW filters 10A of FIG. 5. FIG. 22B shows an equivalent circuit of the SAW filter 20A' that is also formed by connecting two SAW filters 10A. In the SAW filter 20A', the ends of two inductances L1 that are closer to the external ground terminal 9 are connected to each other, and an inductance L2 is provided between the connection point (forming a second-stage common ground terminal 8b) and the external ground terminal 9. The first-stage ground terminals 8a of FIG. 22B are equivalent to the common ground terminal 8 of FIG. 22A.

Figure 23A:
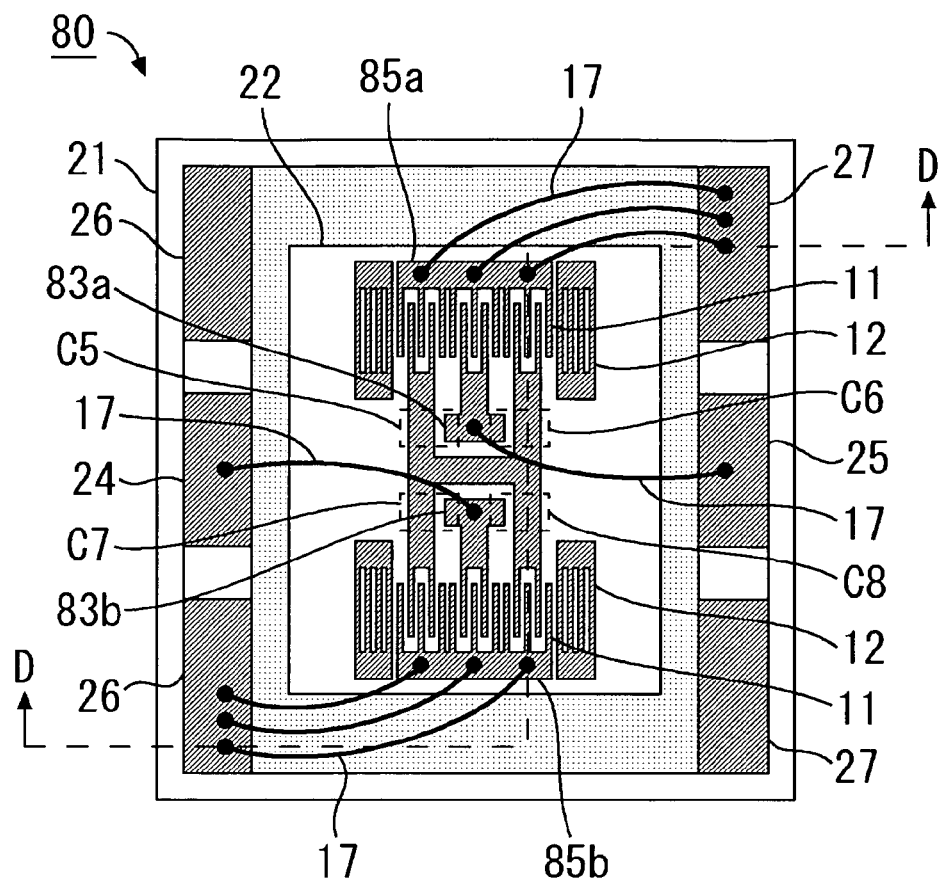
FIG. 23A is a top view of a SAW filter that specifically embodies the structure shown in FIG. 22B.
Figure 23B:
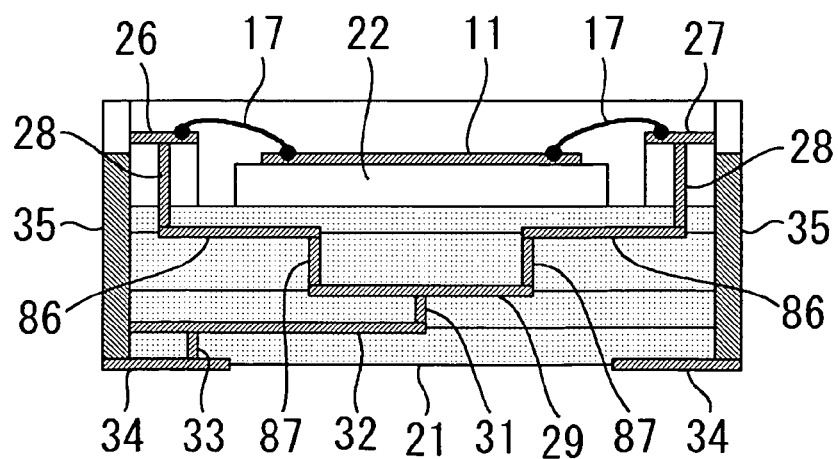
FIG. 23B is a section view of the SAW filter, taken along the line D—D of FIG. 23A.

FIGS. 23A and 23B illustrate a SAW filter 80 that specifically embodies the SAW filter 20A' shown in FIG. 22B. The SAW filter 80 is formed by cascade-connecting two double-mode SAW (DMS) filters each including one IDT 11 on the input side and two IDTs 11 on the output side. FIG. 23A is a top view of the SAW filter 80. FIG. 23B is a section view of the SAW filter 80, taken along the line D—D of FIG. 23A.

As shown in FIG. 23A, the SAW filter 80 has the ground electrode fingers of the input IDT 11 and the ground electrode fingers of the output IDTs 11 extending in the same direction in each stage (in each DMS filter). With this arrangement, capacitances C5 through C8 between the output terminal and input terminals 83a and 83b can be easily formed in a small space on the piezoelectric substrate 22. In each stage, the ground terminal of the input IDT 11 and the ground terminals of the output IDTs 11 can be easily connected to form common ground terminals 85a and 85b on the piezoelectric substrate 22, and the inductance L to be provided between the external ground terminal 9 and each common ground terminal 85a/85b can be made large. Both in the first stage and the second stage, the inductance L1 extending from each common ground terminal 85a/85b can be formed with at least one of the following components: the bonding wires 17, the via 28, a transmission line path 86, a via 87, and the common ground terminal 29. Here, the value of each inductance L1 can also be adjusted by connecting the bonding wires 17 (three bonding wires 17, for example) in parallel in each stage.

In this embodiment, the connection point of the inductance L1 of each stage is connected to the external ground terminal (the ground foot pattern 34) through the via 31, the transmission line path 32, the via 33, and the castellations 35. This connection path is equivalent to the inductance L2 shown in FIG. 22B.

Figure 24:
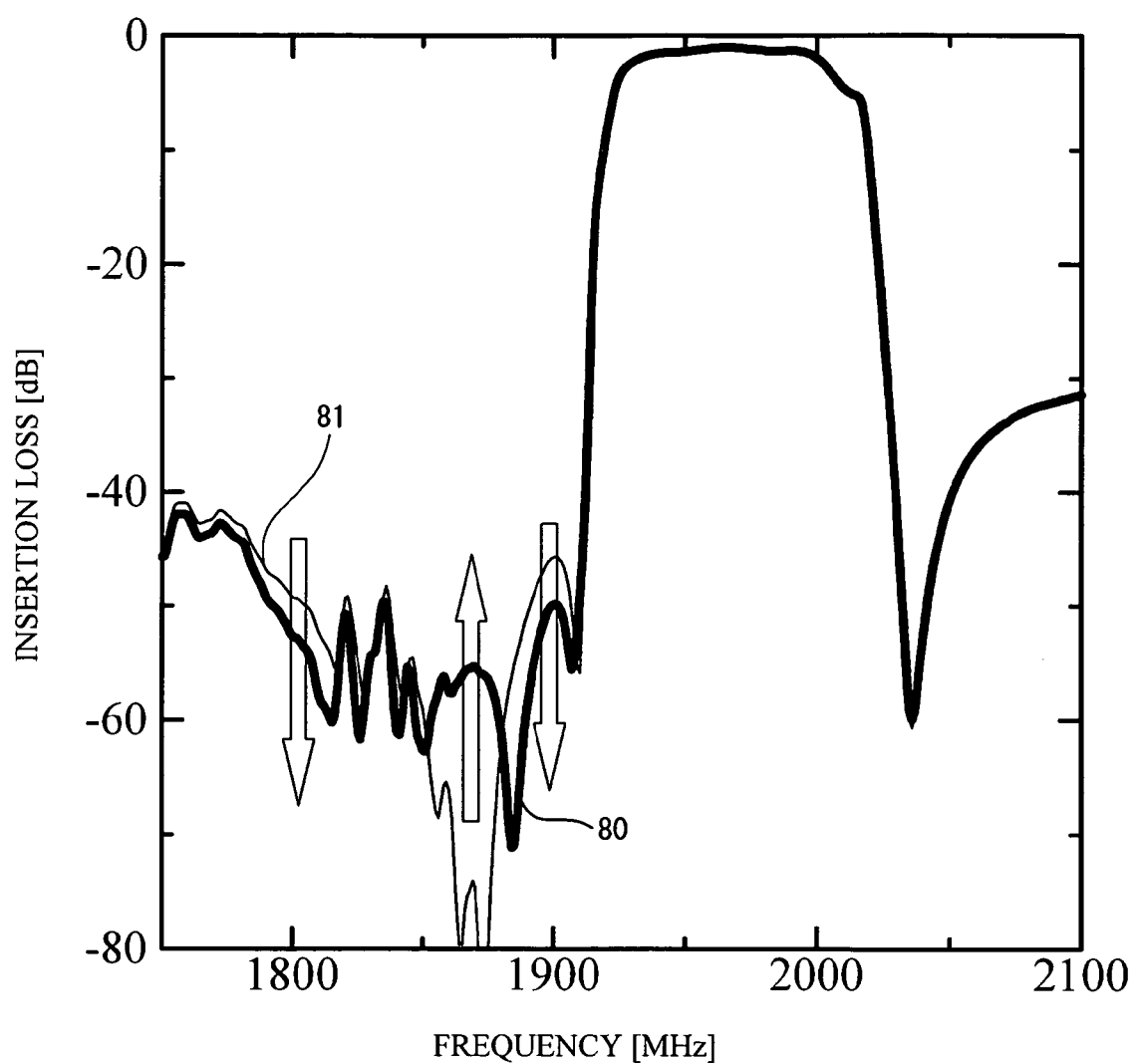
FIG. 24 is a graph showing the filter characteristics of the SAW filter in accordance with the fourth embodiment of the present invention.

FIG. 24 shows the filter characteristics of the SAW filter 80 having the above structure. For purposes of comparison, FIG. 24 also shows the filter characteristics of a SAW filter (having the same structure as the SAW filter shown in FIG. 22A) that does not have the inductance L2. As is apparent from FIG. 24, the two-stage structure formed by cascade-connecting two DMS filters of the present invention can greatly increase the degree of stop-band suppression. Also, the addition of the inductance L2 shown in FIG. 22B further increases the degree of suppression on the low frequency side. The other aspects of this embodiment are the same as those of the foregoing embodiments, and therefore, explanation of them is omitted herein.

(Fifth Embodiment)

Figure 25:
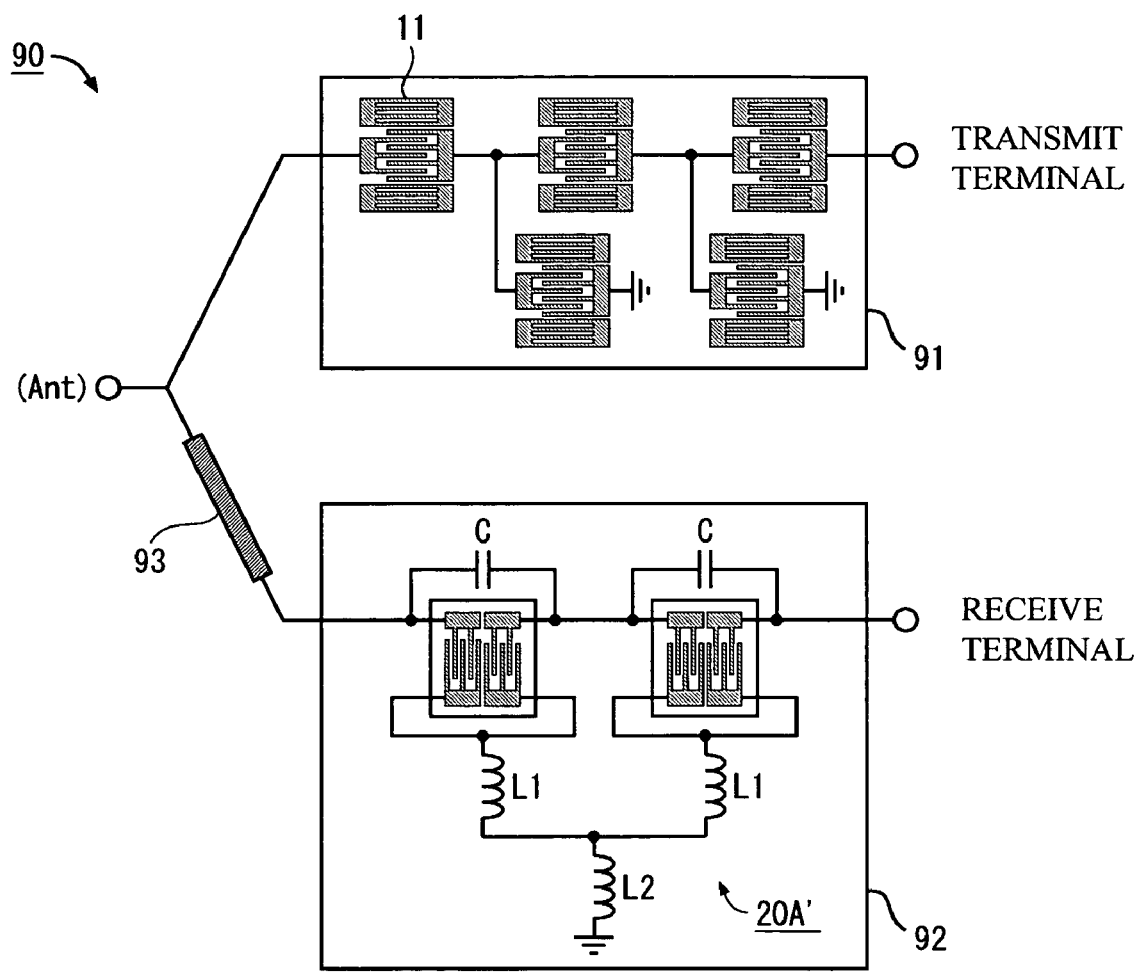
FIG. 25 is a circuit diagram illustrating an antenna duplexer in accordance with a fifth embodiment of the present invention.

A fifth embodiment of the present invention will now be described in detail, with reference to the accompanying drawings. This embodiment is an example case where an antenna duplexer is produced with one of the SAW filters of the foregoing embodiments. FIG. 25 is a circuit diagram of an antenna duplexer 90 in accordance with this embodiment.

As shown in FIG. 25, the antenna duplexer 90 includes a transmit filter 91 and a receive filter 92. In this antenna duplexer 90, a matching circuit 93 for matching input impedances is provided at a common terminal (an antenna terminal: Ant) between the transmit filter 91 and the receive filter 92.

In this structure, the transmit filter 91 may be a ladder filter in which IDTs 11 are connected in a ladder-like fashion. The receive filter 92 may be the SAW filter 20A' of the fourth embodiment shown in FIG. 22B, for example.

Figure 26:
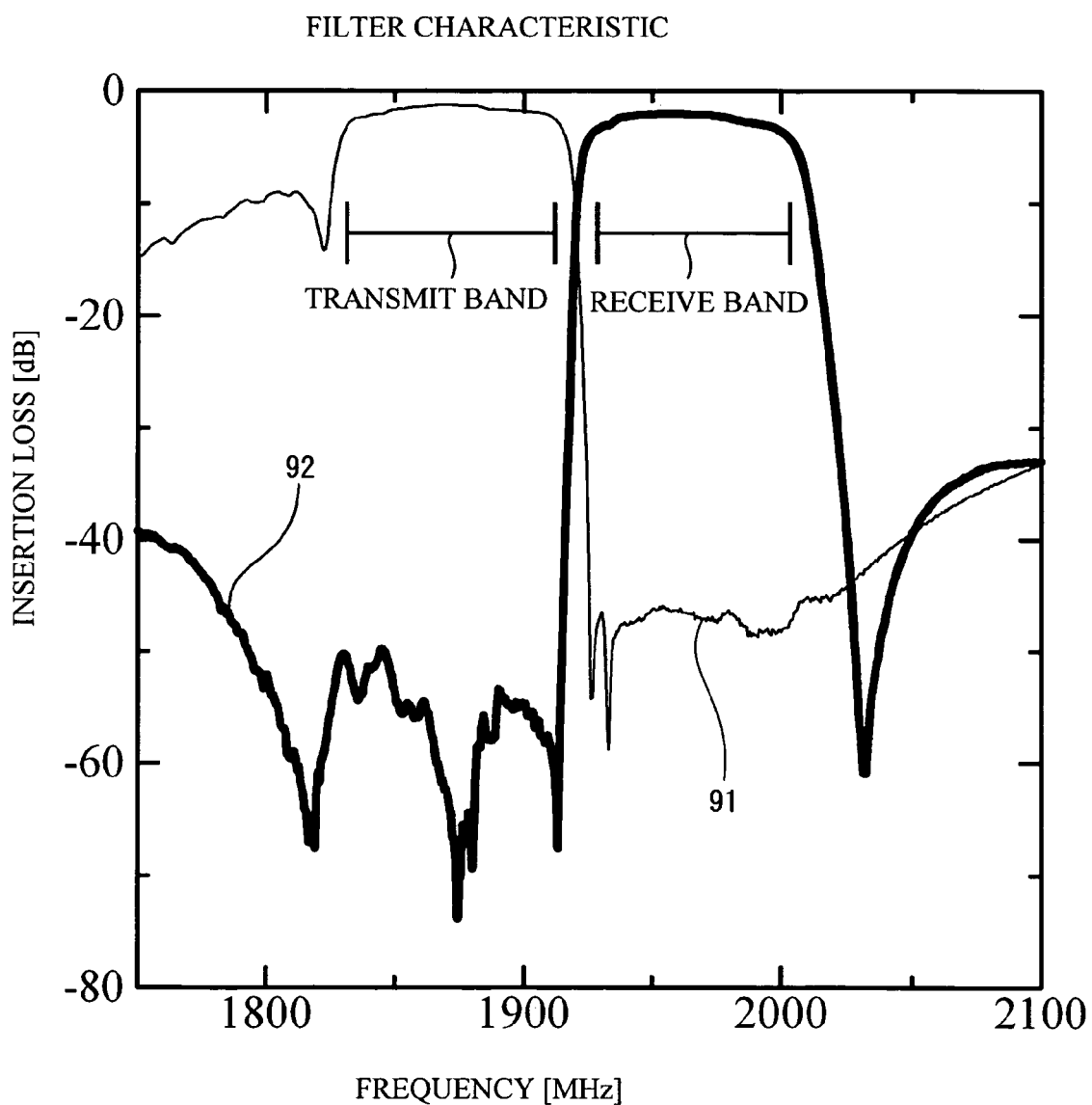
FIG. 26 is a graph showing the frequency characteristics of the antenna duplexer in accordance with the fifth embodiment of the present invention.

FIG. 26 shows the frequency characteristics of the antenna duplexer 90 having the above structure. As is apparent from FIG. 26, the receive filter 92, which is formed by the SAW filter (20A') having a great degree of stop-band suppression in accordance with the present invention, can clearly separate transmitted signals from received signals. The other aspects of this embodiment are the same as those of any of the foregoing embodiments, and therefore, explanation of them is omitted herein.

(Sixth Embodiment)

In the present invention, it is also possible to employ a structure in which the SAW filter input impedance described above is multiplied by N, or N SAW filters including IDTs 11 each having an opening length of 1/N are electrically connected in parallel. In such a structure, the electrode finger resistance can be reduced to $1/N^2$. In the following, such a structure will be described in detail as a sixth embodiment of the present invention.

Figure 27A:
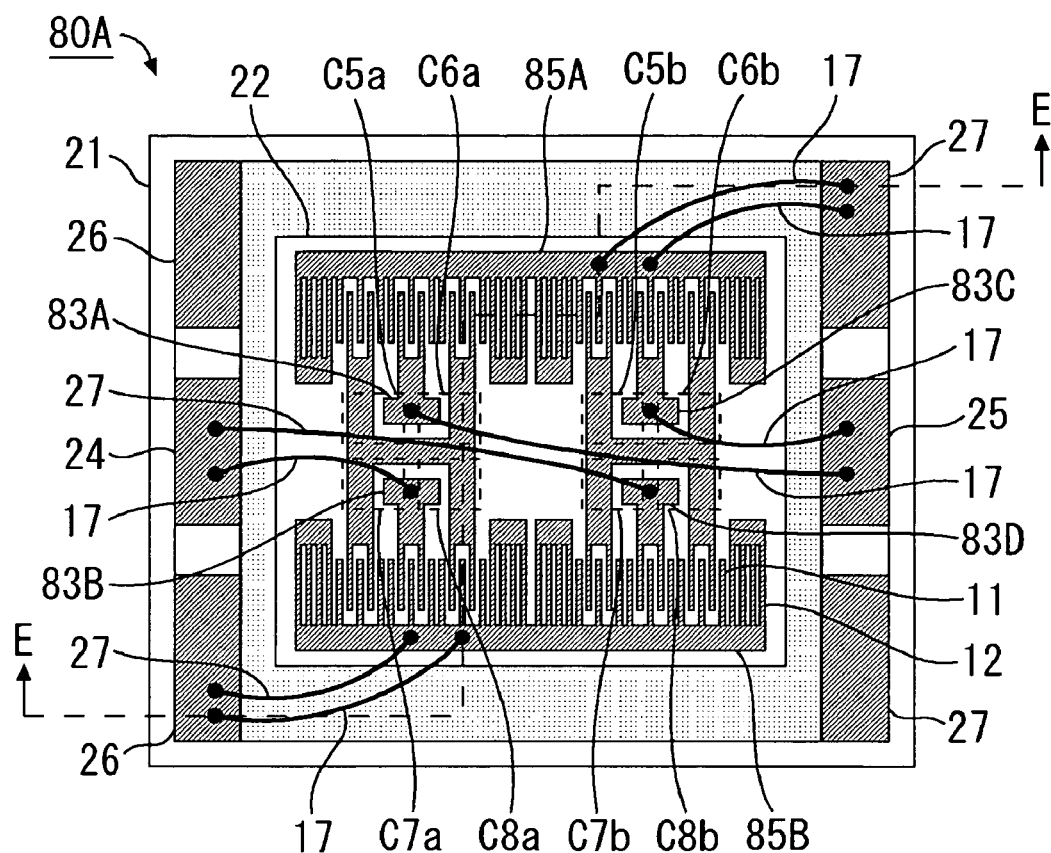
FIG. 27A is a top view of a SAW filter in accordance with a sixth embodiment of the present invention.
Figure 27B:
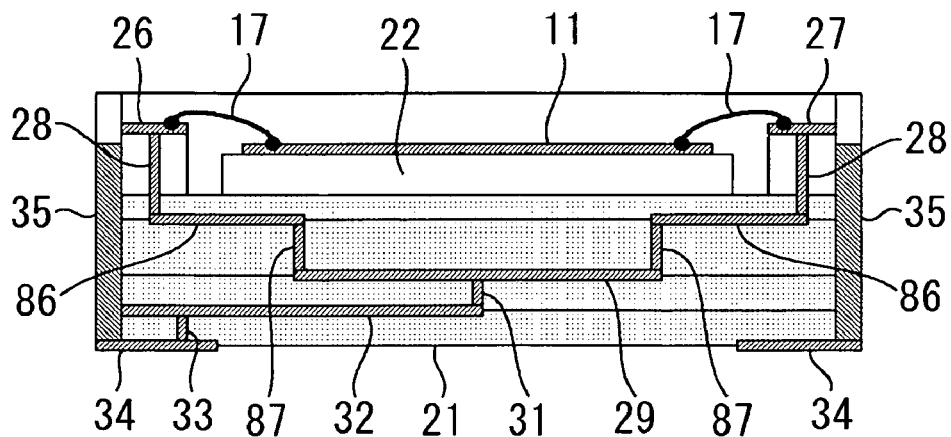
FIG. 27B is a section view of the SAW filter, taken along the line E—E of FIG. 27A.

FIGS. 27A and 27B illustrate a SAW filter 80A in accordance with this embodiment. FIG. 27A is a top view of the SAW filter 80A. FIG. 27B is a section view of the SAW filter 80A, taken along the line E—E of FIG. 27A. In this embodiment, the opening length of each IDT 11 of the SAW filter 80 of the fourth embodiment is set at 1/N, and two SAW filters 80 are cascade-connected in two stages. Further, the two-stage cascade-connected structure is parallel-connected to another two-stage cascade-connected structure that is exactly the same as the former one.

As shown in FIG. 27A, the SAW filter 80A has the ground electrode fingers of the input IDT 11 and the ground electrode fingers of the output IDTs 11 extending in the same direction in each stage (in each DMS filter). With this arrangement, capacitances C5a through C8a and C5b through C8b between the output terminal and input terminals 83A, 83B, 83C, and 83D, can be easily formed in a small space on the piezoelectric substrate 22. In each stage, the ground terminal of the input IDT 11 and the ground terminals of the output IDTs 11 can be easily connected to form common ground terminals 85A and 85B on the piezoelectric substrate 22, and the inductance L to be provided between the external ground terminal 9 and each common ground terminal 85A/85B can be made larger. Both in the first stage and the second stage of the cascade-connected structure, and both in the first stage and the second stage of the parallel-connected structure, the inductance L1 extending from each common ground terminal 85A/85B can be formed with at least one of the following components: the bonding wires 17, the via 28, the transmission line path 86, the via 87, and the common ground terminal 29. Here, the value of each inductance L1 can also be adjusted by connecting the bonding wires 17 (two bonding wires 17, for example) in parallel in each stage.

In this embodiment, the connection point of the inductance L1 of each stage is connected to the external ground terminal (the ground foot pattern 34) through the via 31, the transmission line path 32, the via 33, and the castellations 35. This connection path is equivalent to the inductance L2 shown in FIG. 22B.

With the SAW filter 80A having the above structure, the filter characteristics that exhibit low loss with a reduced electrode finger resistance can be achieved, as well as the effects obtained in accordance with the fourth embodiment. As the value of the capacitance C provided in each one stage is the same as the capacitance value used in a non-parallel connected structure, the value of the capacitance C to be added to each one filter can be halved in the above described two-stage parallel-connected structure. The other aspects of this embodiment are the same as those of any of the foregoing embodiments, and therefore, explanation of them is omitted herein.

(Seventh Embodiment)

Still another example structure that has the IDTs 11, the input terminal 13, and the output terminal 14, formed on the piezoelectric substrate 22, will now be described as a seventh embodiment of the present invention in detail.

Figure 28:
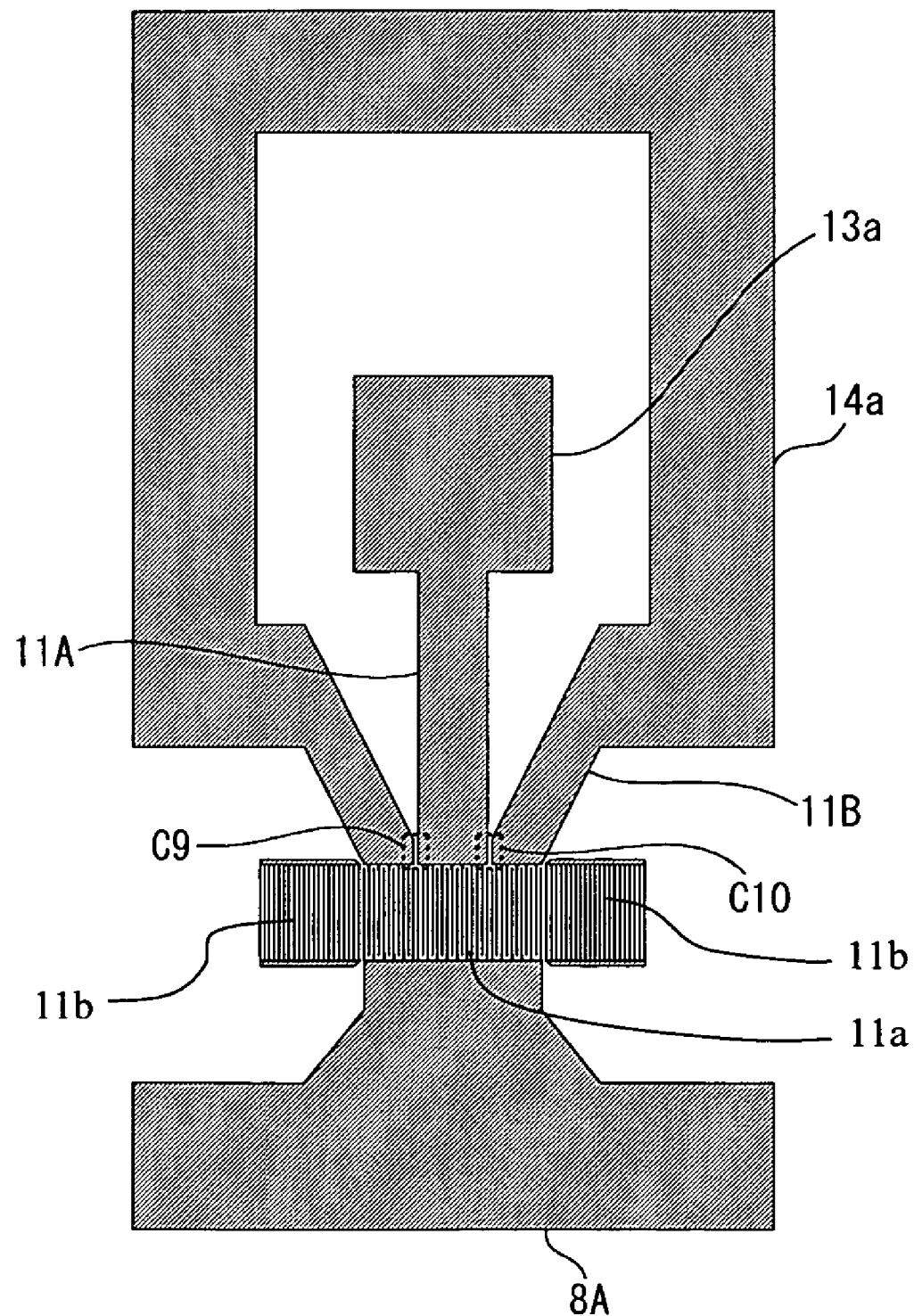
FIG. 28 is a top view of a structure that has IDTs, an input terminal, and an output terminal, formed on a piezoelectric substrate in accordance with a seventh embodiment of the present invention.

FIG. 28 is a top view of the structure that has IDTs (including an input IDT 11a and output IDTs 11b), an input terminal 13a, and an output terminal 14a, formed on the piezoelectric substrate 22, in accordance with this embodiment. The input terminal 13a supply input signals to the input IDT 11a, and the output terminal 14a receive output signals from the output IDTs 11b. As shown in FIG. 28, the structure in accordance with this embodiment has the input terminal 13a and the output terminal 14a extending from the same point in the same direction. Also, a capacitance C is formed between an input bus bar 11A to which the signal electrode fingers of the input IDT 11a are connected, and each output bus bar 11B to which the signal electrode fingers of each corresponding output IDT 11b are connected. With this structure, capacitances C (C9 and C10) can be formed in a very small space with precision. Thus, a small-sized SAW filter can be obtained.

Further, a shared ground terminal (a common ground terminal 8A) is provided on the opposite side of the electrode fingers from the input terminal 13a and the output terminal 14a. The inductance L is then attached to the common ground terminal 8A in the same manner as in each of the foregoing embodiments, so that a SAW filter that utilizes the principles of the present invention can be produced. The other aspects of this embodiment are the same as those of any of the foregoing embodiments, and therefore, explanation of them is omitted herein.

(Other Embodiments)

Although 1.9 GHz band SAW filters have been described, SAW filters in accordance with the present invention are not limited to that frequency band, and any appropriate frequency band may be selected in practice.

Also, in each of the foregoing embodiments, the bonding wires 17 are used to mount a SAW device to a package. However, the present invention is not limited to that structure, and may employ a structure in which a SAW device is flip-chip mounted onto the die-attach surface of a package in a face-down state, for example. In such a structure, the connection path (including a transmission line path, a via, and castellations) that leads to the ground foot pattern is used as the inductance L. For example, a serpentine line path may be formed on the die-attach surface, so as to form an inductance.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A surface acoustic wave filter comprising:
   an input interdigital transducer and an output interdigital transducer that are formed on a piezoelectric substrate;
   a capacitance that is provided between an input terminal of the input interdigital transducer and an output terminal of the output interdigital transducer;
   a first common ground terminal that connects a ground terminal of the input interdigital transducer and a ground terminal of the output interdigital transducer;
   an inductance that is provided between the first common ground terminal and a ground; and
   an odd number of resonance frequencies, wherein the pass phase of the lowest resonance frequency and the pass phase of the highest resonance frequency among the odd number of resonance frequencies are both approximately 0 degrees.

2. The surface acoustic wave filter as claimed in claim 1, wherein the capacitance is formed on the piezoelectric substrate.

3. The surface acoustic wave filter as claimed in claim 1, wherein the first common ground terminal is formed on the piezoelectric substrate.

4. The surface acoustic wave filter as claimed in claim 1, further comprising a package that accommodates the piezoelectric substrate,
   wherein the inductance comprises at least one of a transmission line path that is provided in the package, a via that is provided in the package, a castellation that is provided in the package, and a wire that electrically connects the first common ground terminal and the package.

5. A surface acoustic wave filter comprising:
   an input interdigital transducer and an output interdigital transducer that are formed on a piezoelectric substrate;
   a capacitance that is provided between an input terminal of the input interdigital transducer and an output terminal of the output interdigital transducer;
   a first common ground terminal that connects a ground terminal of the input interdigital transducer and a ground terminal of the output interdigital transducer;
   an inductance that is provided between the first common ground terminal and a ground; and
   an odd number of resonance frequencies, wherein each pass phase of the resonance frequencies of even numbers that follow from the lowest resonance frequency among the odd number of resonance frequencies is approximately 180 degrees.

6. A surface acoustic wave filter comprising:
   an input interdigital transducer and an output interdigital transducer that are formed on a piezoelectric substrate;
   a capacitance that is provided between an input terminal of the input interdigital transducer and an output terminal of the output interdigital transducer;
   a first common ground terminal that connects a ground terminal of the input interdigital transducer and a ground terminal of the output interdigital transducer; and
   an inductance that is provided between the first common ground terminal and a ground, wherein:
   one of an electrode finger of the input interdigital transducer that is the closest to the output interdigital transducer and an electrode finger of the output interdigital transducer that is the closest to the input interdigital transducer is a ground electrode finger, while the other one is a signal electrode finger; and
   the distance D between the electrode centers of the electrode finger of the input interdigital transducer that is the closest to the output interdigital transducer and the electrode finger of the output interdigital transducer that is the closest to the input interdigital transducer satisfies the following expression (2):

$$\frac{3\lambda}{4} + n\lambda < D < \frac{5\lambda}{4} + n\lambda \qquad (2)$$

where λ represents the center wavelength of surface acoustic waves, and n is an integer of 0 or greater.

7. A surface acoustic wave filter comprising:
   an input interdigital transducer and an output interdigital transducer that are formed on a piezoelectric substrate;
   a capacitance that is provided between an input terminal of the input interdigital transducer and an output terminal of the output interdigital transducer;
   a first common ground terminal that connects a ground terminal of the input interdigital transducer and a ground terminal of the output interdigital transducer; and
   an inductance that is provided between the first common ground terminal and a ground,
   wherein electrode fingers connected to the ground terminal of the input interdigital transducer extend in the same direction as electrode fingers connected to the ground terminal of the output interdigital transducer.

8. A surface acoustic wave filter comprising:
   an input interdigital transducer and an output interdigital transducer that are formed on a piezoelectric substrate;

a capacitance that is provided between an input terminal of the input interdigital transducer and an output terminal of the output interdigital transducer;

a first common ground terminal that connects a ground terminal of the input interdigital transducer and a ground terminal of the output interdigital transducer; and an inductance that is provided between the first common ground terminal and a ground, wherein the input terminal and the output terminal are located on the same side in a direction orthogonal to a direction in which a surface acoustic wave is propagated and extend in the same direction.

9. A surface acoustic wave filter comprising:

an input interdigital transducer and an output interdigital transducer that are formed on a piezoelectric substrate;

a first common ground terminal that connects a ground terminal of the input interdigital transducer and a ground terminal of the output interdigital transducer; and an inductance that is provided between the first common ground terminal and a ground, wherein an electrically conductive input bus bar of the input interdigital transducer to which electrode fingers are connected and an electrically conductive output bus bar of the output interdigital transducer to which electrode fingers are connected forms a capacitance provided between an input terminal of the input interdigital transducer and an output terminal of the output interdigital transducer.

10. A duplexer comprising a surface acoustic wave filter that includes:

an input interdigital transducer and an output interdigital transducer that are formed on a piezoelectric substrate;

a capacitance that is provided between an input terminal of the input interdigital transducer and an output terminal of the output interdigital transducer;

a first common ground terminal that connects a ground terminal of the input interdigital transducer and a ground terminal of the output interdigital transducer;

an inductance that is provided between the first common ground terminal and a ground; and an odd number of resonance frequencies, wherein the pass phase of the lowest resonance frequency and the pass phase of the highest resonance frequency among the odd number of resonance frequencies are both approximately 0 degrees.

11. A surface acoustic wave filter comprising a plurality of surface acoustic wave filters that are cascade-connected, each cascade-connected surface acoustic wave filter including:

an input interdigital transducer and an output interdigital transducer that are formed on a piezoelectric substrate;

a capacitance that is provided between an input terminal of the input interdigital transducer and an output terminal of the output interdigital transducer;

a first common ground terminal that connects a ground terminal of the input interdigital transducer and a ground terminal of the output interdigital transducer;

an inductance that is provided between the first common ground terminal and a ground; and an odd number of resonance frequencies, wherein the pass phase of the lowest resonance frequency and the pass phase of the highest resonance frequency among the odd number of resonance frequencies are both approximately 0 degrees.

12. A surface acoustic wave filter comprising a plurality of surface acoustic wave filters that are cascade-connected, each cascade-connected surface acoustic wave filter including:

an input interdigital transducer and an output interdigital transducer that are formed on a piezoelectric substrate;

a capacitance that is provided between an input terminal of the input interdigital transducer and an output terminal of the output interdigital transducer;

a first common ground terminal that connects a ground terminal of the input interdigital transducer and a ground terminal of the output interdigital transducer; and an inductance that is provided between the first common ground terminal and a ground; and a second common ground terminal that connects the first common ground terminal of each stage of the surface acoustic wave filter to the first common ground terminals of the other stages, wherein the inductance is provided between the first common ground terminal and the second common ground terminal, and also between the second common ground terminal and the ground.

13. A surface acoustic wave filter comprising a plurality of surface acoustic wave filters that are cascade-connected, each cascade-connected surface acoustic wave filter including:

an input interdigital transducer and an output interdigital transducer that are formed on a piezoelectric substrate;

a capacitance that is provided between an input terminal of the input interdigital transducer and an output terminal of the output interdigital transducer;

a first common ground terminal that connects a ground terminal of the input interdigital transducer and a ground terminal of the output interdigital transducer; and an inductance that is provided between the first common ground terminal and a ground; and a package that accommodates the piezoelectric substrate, wherein the inductance comprises at least one of a transmission line path that is provided in the package, a via that is provided in the package, a castellation that is provided in the package, and a wire that electrically connects the first common ground terminal and the package.

14. A surface acoustic wave filter comprising a plurality of surface acoustic wave filters that are parallel-connected, each parallel-connected surface acoustic wave filter including:

an input interdigital transducer and an output interdigital transducer that are formed on a piezoelectric substrate;

a capacitance that is provided between an input terminal of the input interdigital transducer and an output terminal of the output interdigital transducer;

a first common ground terminal that connects a ground terminal of the input interdigital transducer and a ground terminal of the output interdigital transducer; and an inductance that is provided between the first common ground terminal and a ground.

15. A surface acoustic wave filter comprising a plurality of surface acoustic wave filters that are cascade-connected, each cascade-connected surface acoustic wave filter including:

an input interdigital transducer and an output interdigital transducer that are formed on a piezoelectric substrate;

a capacitance that is provided between an input terminal of the input interdigital transducer and an output terminal of the output interdigital transducer;

a first common ground terminal that connects a ground terminal of the input interdigital transducer and a ground terminal of the output interdigital transducer;

an inductance that is provided between the first common ground terminal and a ground; and an odd number of resonance frequencies, wherein the pass phase of the lowest resonance frequency and the pass phase of the highest resonance frequency among the odd number of resonance frequencies are both approximately 0 degrees, and wherein the output interdigital transducer is provided on both sides of the input interdigital transducer in the surface acoustic wave propagating direction.

16. A surface acoustic wave filter comprising a plurality of surface acoustic wave filters that are cascade-connected, each cascade-connected surface acoustic wave filter including:

an input interdigital transducer and an output interdigital transducer that are formed on a piezoelectric substrate;

a capacitance that is provided between an input terminal of the input interdigital transducer and an output terminal of the output interdigital transducer;

a first common ground terminal that connects a ground terminal of the input interdigital transducer and a ground terminal of the output interdigital transducer; and an inductance that is provided between the first common ground terminal and a ground, wherein an electrode finger of the input interdigital transducer that is the closest to the output interdigital transducer and an electrode finger of the output interdigital transducer that is the closest to the input interdigital transducer are both ground electrode fingers or signal electrode fingers, and wherein SAW propagation paths of the input and output interdigital transducers have an overlapping portion.

17. A surface acoustic wave filter comprising a plurality of surface acoustic wave filters that are cascade-connected, each cascade-connected surface acoustic wave filter including:

an input interdigital transducer and an output interdigital transducer that are formed on a piezoelectric substrate;

a capacitance that is provided between an input terminal of the input interdigital transducer and an output terminal of the output interdigital transducer;

a first common ground terminal that connects a ground terminal of the input interdigital transducer and a ground terminal of the output interdigital transducer; and an inductance that is provided between the first common ground terminal and a ground, wherein an electrode finger of the input interdigital transducer that is the closest to the output interdigital transducer and an electrode finger of the output interdigital transducer that is the closest to the input interdigital transducer are both ground electrode fingers or signal electrode fingers, wherein the distance D between the electrode centers of the electrode finger of the input interdigital transducer that is the closest to the output interdigital transducer and the electrode finger of the output interdigital transducer that is the closest to the input interdigital transducer satisfies the following expression (1):

$$\frac{\lambda}{4} + n\lambda < D < \frac{3\lambda}{4} + n\lambda \quad (1)$$

where $\lambda$ represents the center wavelength of surface acoustic waves, and n is an integer of 0 or greater.

* * * * *